US012765347B2

(12) United States Patent
Lee et al.

(10) Patent No.: US 12,765,347 B2
(45) Date of Patent: Oct. 13, 2026

(54) SEMICONDUCTOR DEVICE AND METHOD FOR MANUFACTURING THE SAME

(71) Applicant: SAMSUNG ELECTRONICS CO., LTD., Suwon-si (KR)

(72) Inventors: Dongick Anthony Lee, Suwon-si (KR); Minchan Gwak, Suwon-si (KR); Gukhee Kim, Suwon-si (KR); Youngwoo Kim, Suwon-si (KR); Sangcheol Na, Suwon-si (KR); Kyoungwoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 18/220,971

(22) Filed: Jul. 12, 2023

(65) Prior Publication Data

US 2024/0047306 A1 Feb. 8, 2024

(30) Foreign Application Priority Data

Aug. 2, 2022 (KR) ........................ 10-2022-0095806

(51) Int. Cl.
*H10W 20/20* (2026.01)
*H10D 30/01* (2025.01)
(Continued)

(52) U.S. Cl.
CPC .......... *H10W 20/20* (2026.01); *H10D 30/024* (2025.01); *H10D 30/6211* (2025.01); *H10D 64/017* (2025.01)

(58) Field of Classification Search
CPC .. H10S 30/6211; H10S 64/017; H10S 30/024; H10W 20/20; H10D 30/6211; H10D 64/017; H10D 30/024
See application file for complete search history.

(56) References Cited

U.S. PATENT DOCUMENTS

| | | | |
|---|---|---|---|
| 8,592,991 | B2 | 11/2013 | Lee et al. |
| 8,696,875 | B2 | 4/2014 | Ding et al. |

(Continued)

FOREIGN PATENT DOCUMENTS

| | | |
|---|---|---|
| KR | 10-1697573 | 1/2017 |
| KR | 10-1870155 | 6/2018 |

(Continued)

*Primary Examiner* — Christine A Enad
(74) *Attorney, Agent, or Firm* — Morgan, Lewis & Bockius LLP

(57) ABSTRACT

A semiconductor device includes a base layer including a silicon material. A field effect transistor is disposed on a first surface of the base layer. A first insulating interlayer covers the field effect transistor, A buried vertical rail passes through the first insulating interlayer and the base layer. The buried vertical rail includes a first metal pattern and a first barrier pattern surrounding a sidewall of the first metal pattern. A first lower insulating interlayer is on the second surface of the base layer. A lower contact plug passes through the first lower insulating interlayer and directly contacts a lower surface of the buried vertical rail. The lower contact plug includes a second metal pattern and a second barrier pattern surrounding a sidewall of the second metal pattern. A bottom surface of the first metal pattern and a top surface of the second metal pattern directly contact each other.

17 Claims, 20 Drawing Sheets

(51) Int. Cl.
*H10D 30/62* (2025.01)
*H10D 64/01* (2025.01)

(56) References Cited

U.S. PATENT DOCUMENTS

| | | | |
|---|---|---|---|
| 8,952,543 | B2 | 2/2015 | Lee et al. |
| 9,147,640 | B2 | 9/2015 | Lee et al. |
| 9,343,361 | B2 | 5/2016 | Lee et al. |
| 9,779,992 | B2 | 10/2017 | Kitao et al. |
| 9,806,004 | B2 | 10/2017 | Lee et al. |
| 9,941,196 | B2 | 4/2018 | Lee et al. |
| 11,177,286 | B2 | 11/2021 | Kim et al. |
| 2013/0119543 | A1 | 5/2013 | Yu et al. |
| 2020/0373331 | A1* | 11/2020 | Kim ..................... H10D 86/215 |
| 2021/0028112 | A1* | 1/2021 | Kim ................... H10D 84/0158 |
| 2022/0002889 | A1 | 1/2022 | Kim et al. |

FOREIGN PATENT DOCUMENTS

| | | |
|---|---|---|
| KR | 10-2021884 | 9/2019 |
| KR | 10-2020-0133630 | 11/2020 |
| KR | 10-2021-0012084 | 2/2021 |
| KR | 10-2279729 | 7/2021 |

* cited by examiner

SEMICONDUCTOR DEVICE AND METHOD FOR MANUFACTURING THE SAME

CROSS-REFERENCE TO RELATED APPLICATION

This application claims priority under 35 USC § 119 to Korean Patent Application No. 10-2022-0095806, filed on Aug. 2, 2022 in the Korean Intellectual Property Office, the disclosure of which is incorporated by reference in its entirety herein.

TECHNICAL FIELD

Embodiments of the present disclosure relate to a semiconductor device and method for manufacturing the same. In particular, embodiments relate to a semiconductor device including power delivery network wirings on a back side of a base layer and method for manufacturing the same.

DISCUSSION OF RELATED ART

In a highly integrated semiconductor device, circuit elements and wirings for transmitting signals to the circuit elements may be formed on a front side of a base layer, and wirings for a power delivery may be formed on a back side of the base layer. A process for forming the wiring on the back side of the base layer may include a depositing and etching process of a metal material. Defects may occur during the processes of the depositing and etching of the metal material for forming the wiring on the back side of the base layer.

SUMMARY

An example embodiment provides a semiconductor device having excellent electrical characteristics.

An example embodiment provides a method for manufacturing a semiconductor device having excellent electrical characteristics.

According to an embodiment, a semiconductor device includes a base layer including a silicon material. The base layer includes a first surface and a second surface opposite to the first surface in a vertical direction. A field effect transistor is disposed on the first surface of the base layer. A first insulating interlayer covers the field effect transistor. A buried vertical rail passes through the first insulating interlayer and the base layer. The buried vertical rail includes a first metal pattern having a sidewall and a first barrier pattern surrounding the sidewall of the first metal pattern, A first lower insulating interlayer is on the second surface of the base layer. A lower contact plug passes through the first lower insulating interlayer and directly contacts a lower surface of the buried vertical rail. The lower contact plug includes a second metal pattern having a sidewall and a second barrier pattern surrounding the sidewall of the second metal pattern. A bottom surface of the first metal pattern and a top surface of the second metal pattern directly contact each other.

According to an embodiment, a semiconductor device includes a base layer including a silicon material. The base layer includes a first surface and a second surface opposite to the first surface in a vertical direction. Active fins protrude from the first surface of the base layer in the vertical direction. The active fins extend in a first direction. A gate structure is on the first surface of the base layer. The gate structure extends in a second direction perpendicular to the first direction and crosses the active fins. Semiconductor patterns are on active fins adjacent to both sides of the gate structure. The semiconductor patterns include impurity regions. A first insulating interlayer is on the first surface of the base layer. The first insulating interlayer covers the gate structure and the semiconductor patterns. A buried vertical rail passes through the first insulating interlayer and the base layer in the vertical direction. The buried vertical mil includes a first metal pattern having a sidewall and a first barrier pattern surrounding the sidewall of the first metal pattern. A first lower insulating interlayer is on the second surface of the base layer. A lower contact plug passes through the first lower insulating interlayer in the vertical direction and directly contacts a lower surface of the buried vertical rail. The lower contact plug includes a second metal pattern having a sidewall and a second barrier pattern surrounding the sidewall of the second metal pattern. A bottom surface of the first metal pattern and a top surface of the second metal pattern directly contact each other.

According to an embodiment, a method for manufacturing a semiconductor device includes forming a field effect transistor on a first surface of a substrate. A first insulating interlayer is formed that covers the field effect transistor. A preliminary buried vertical rail is formed that extends through the first insulating interlayer to an upper portion of the substrate. The preliminary buried vertical rail includes a first metal pattern having a sidewall and a bottom and a first preliminary barrier pattern surrounding the sidewall and the bottom of the first metal pattern. A second surface of the substrate that is opposite to the first surface is removed to expose a lower surface of the first preliminary barrier pattern to form a base layer. A first lower insulating interlayer is formed on a lower surface of the base laver. A first hole is formed that passes through the first lower insulating interlayer and exposes the first preliminary barrier pattern of the preliminary buried vertical rail. A buried vertical rail is formed that includes a first barrier pattern and the first metal pattern by etching the first preliminary barrier pattern exposed by the first hole to form the first barrier pattern. A second barrier layer is formed on a sidewall of the first hole and a bottom of the buried vertical rail. The second barrier layer is etched on a lower surface of the buried vertical rail to form a second barrier pattern on the sidewall of the first hole. A second metal pattern is formed that fills the first hole and directly contacts the first metal pattern on the second barrier pattern to form a lower contact plug including the second metal pattern having a sidewall and the second barrier pattern surrounding the sidewall of the second metal pattern.

In an example embodiment, the semiconductor device may not include a barrier pattern at a contact portion between the first metal pattern passing through the base layer and the second metal pattern formed on the second surface of the base layer. Thus, contact resistance between the first metal pattern and the second metal pattern may be decreased. In addition, etching processes for forming the barrier pattern surrounding of a sidewall of each of the first and second metal patterns may be controlled so as to decrease a residue due to re-sputtering of a metal during the etching process.

BRIEF DESCRIPTION OF THE DRAWINGS

Some example embodiments of the present disclosure will be more clearly understood from the following detailed description taken in conjunction with the accompanying drawings.

FIGS. 1 to 26 represent non-limiting, example embodiments of the present disclosure as described herein.

FIG. 1 is a cross-sectional view illustrating a semiconductor device in accordance with an example embodiment;

FIG. 3 is a plan view of a transistor portion in a semiconductor device in accordance with an example embodiment;

FIG. 4 is a cross-sectional view of a gate structure of a fin field effect transistor (fin FET) in accordance with an example embodiment;

FIG. 5 is a cross-sectional view of a gate structure of a multi-bridge channel-field effect transistor (MBC FET) in accordance with an example embodiment;

FIGS. 8 and 15 are plan views illustrating a method of manufacturing a semiconductor device in accordance with some example embodiments.

FIGS. 6, 9, 11 to 14 and 16 to 24 are cross-sectional views taken along line I-I' of FIG. 8 illustrating a method of manufacturing a semiconductor device in accordance with some example embodiments.

FIGS. 7 and 10 are cross-sectional views taken along line II-II' of FIG. 8 illustrating a method of manufacturing a semiconductor device in accordance with some example embodiments.

FIGS. 25 and 26 are cross-sectional views illustrating a method of manufacturing a semiconductor device in accordance with some example embodiments.

DETAILED DESCRIPTION OF EMBODIMENTS

Hereinafter, embodiments of the present disclosure will be described in detail with reference to the accompanying drawings.

Hereinafter, a direction parallel to an upper surface of a substrate is referred to as a first direction, and a direction parallel to the upper surface of the substrate and perpendicular to the first direction is referred to as a second direction. In addition, a direction perpendicular to the surface of the substrate is referred to as a vertical direction.

Figure 1:
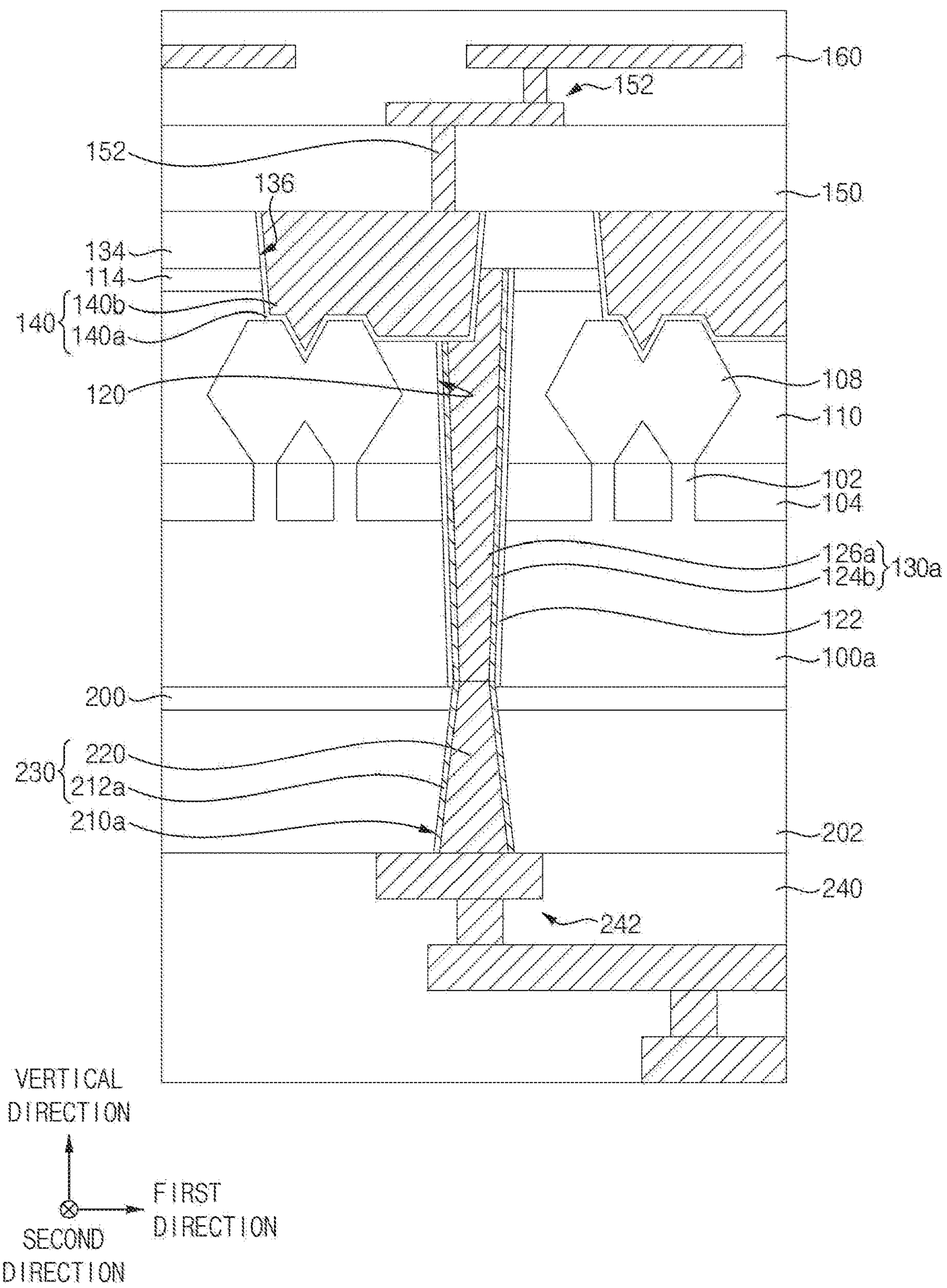
Figure 2A:
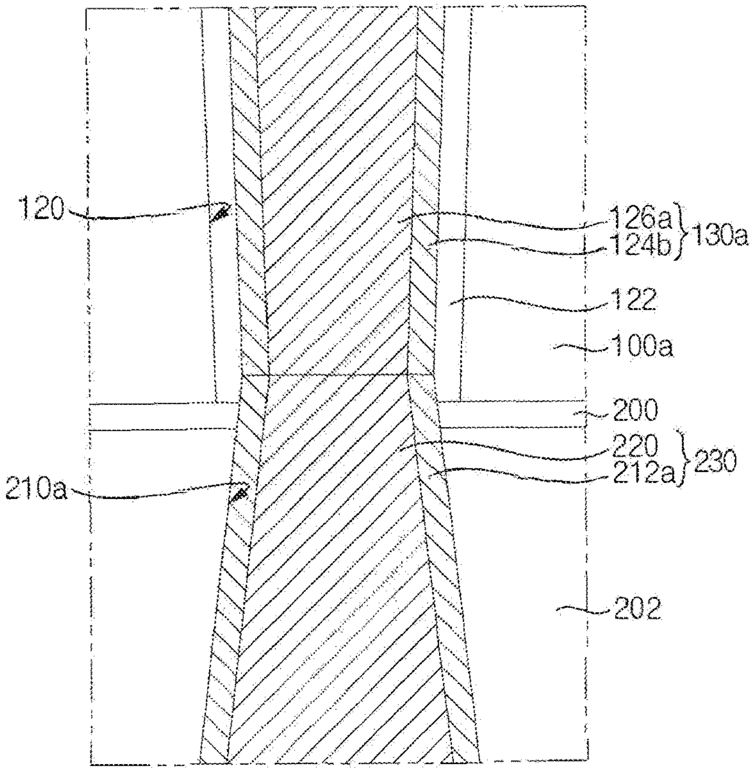
FIGS. 2A and 2B are enlarged cross-sectional views illustrating a portion of a semiconductor device in accordance with some example embodiments, respectively.
Figure 2B:
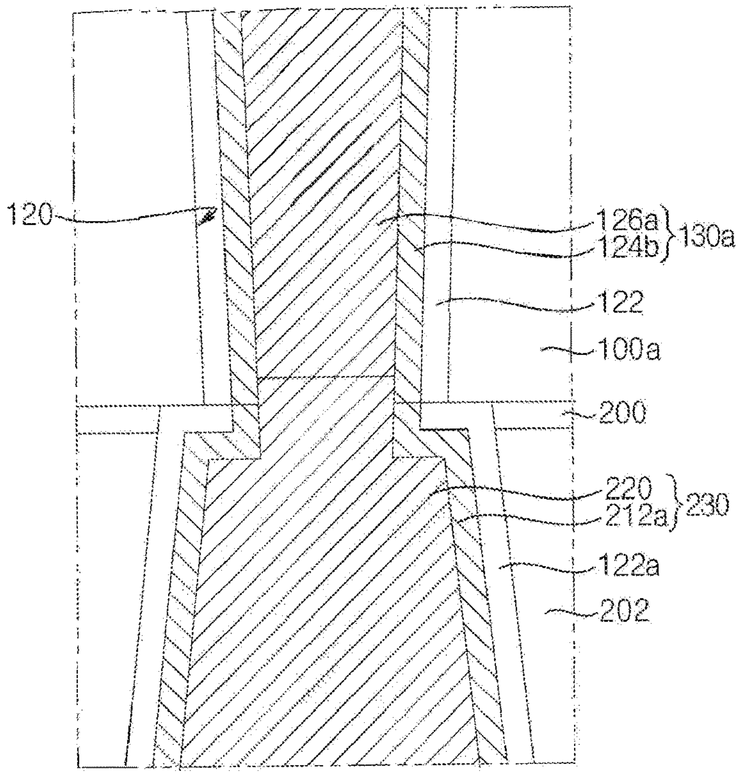
Figure 3:
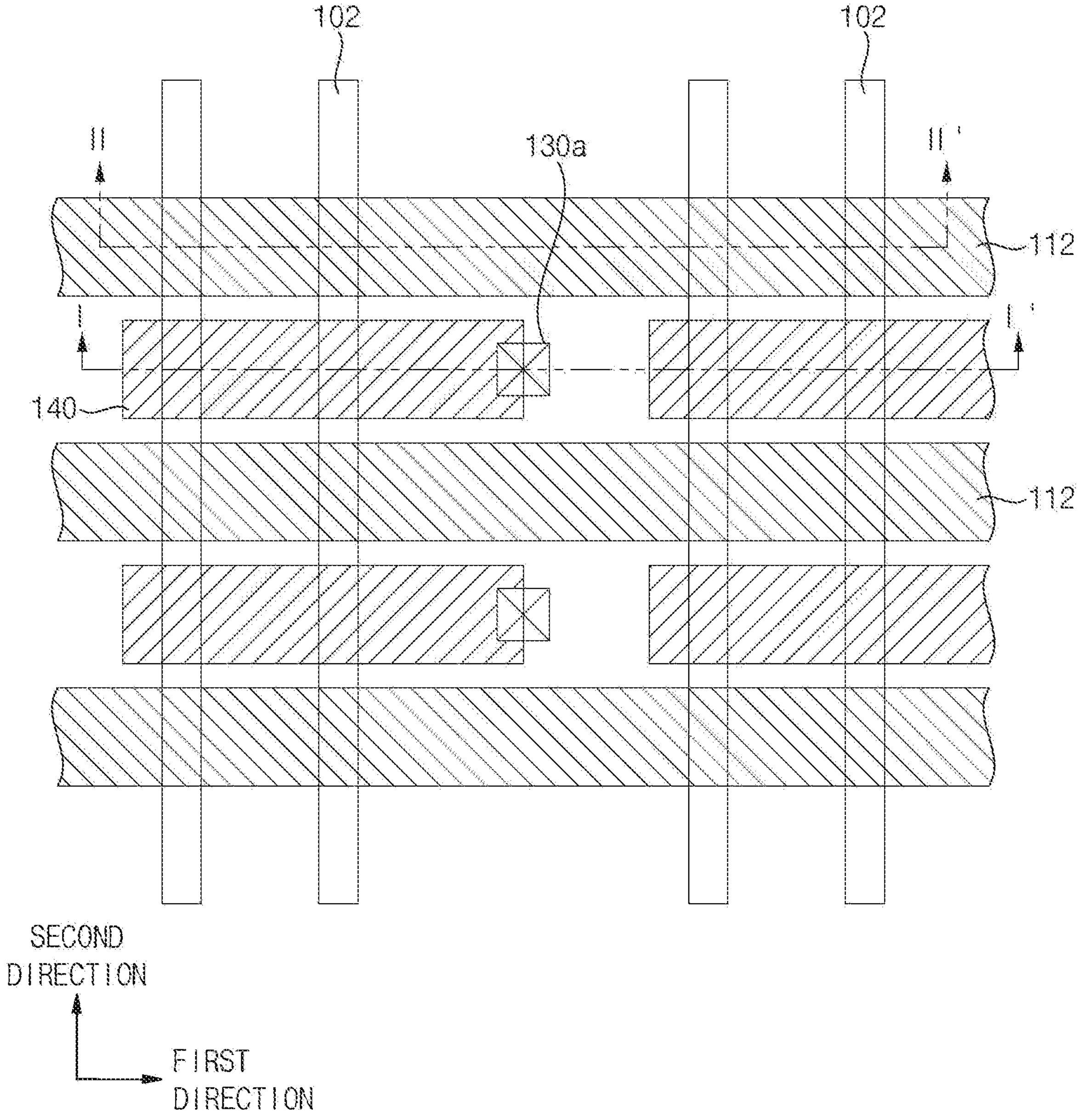
Figure 4:
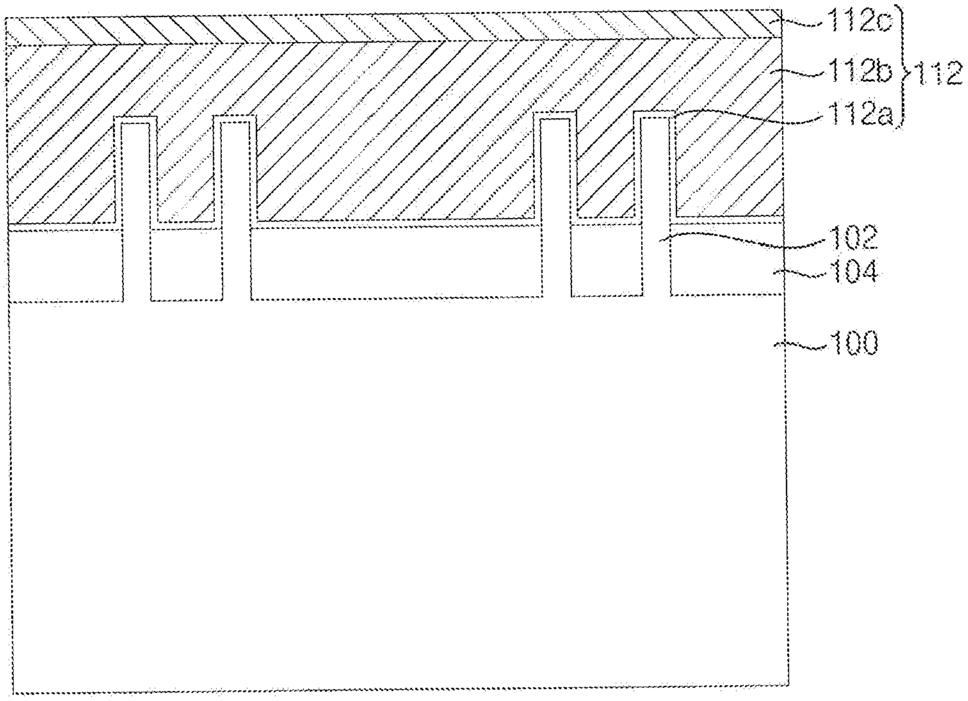
Figure 5:
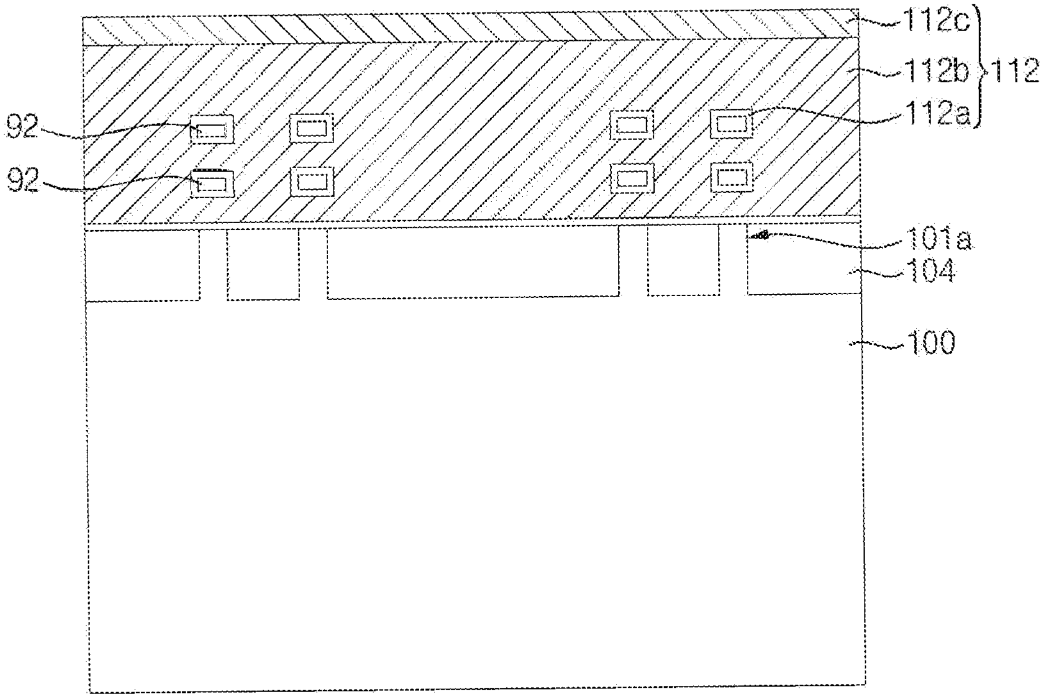

FIG. 1 is a cross-sectional view illustrating a semiconductor device in accordance with an example embodiment. FIGS. 2A and 2B are enlarged cross-sectional views illustrating a portion of a semiconductor device in accordance with some example embodiments, respectively. FIG. 3 is a plan view of a transistor portion in a semiconductor device in accordance with an example embodiment. FIG. 4 is a cross-sectional view of a gate structure of a fin field effect transistor (fin FET) in accordance with an example embodiment. FIG. 5 is a cross-sectional view of a gate structure of a multi-bridge channel-field effect transistor (MBC FET) in accordance with an example embodiment.

FIG. 1 is a cross-sectional view taken along line I-I' of FIG. 3. Each of FIGS. 2A and 2B include a contact portion between a buried vertical rail and a first lower contact plug. FIG. 4 is a cross-sectional view taken along line II-II' of FIG. 3 serving as the fin FET. FIG. 5 is a cross-sectional view taken along line II-II' of FIG. 3 serving as the MBC FET.

Referring to FIGS. 1 to 3, the semiconductor device may include a field effect transistor, such as a fin FET or an MBC FET. Hereinafter, the semiconductor device including the fin FET may be mainly described for convenience of explanation. However, embodiments of the present disclosure are not necessarily limited thereto.

The fin FET may constitute a logic cell. In an embodiment, the logic cell may be configured in various different forms, such as AND, NAND, OR, NOR, exclusive OR (XOR), exclusive NOR (XNOR), inverter (INV), adder (ADD), buffer (BUF), delay (DLY), filter (FIL), multiplexer (MXT/MXIT), OAI (OR/AND/INVERTER), AO (AND/OR), AOI (AND/OR/INVERTER), D flip-flop, reset flip-flop, master-slaver flip-flop and latch, etc. The logic cells may constitute standard cells that perform desired logical functions such as counters and buffers.

A base layer 100*a* may include a semiconductor material, such as a silicon material. The base layer 100*a* may be formed so as to have a relatively thin thickness by removing one surface of a substrate including a semiconductor material. For example, in an embodiment the base layer 100*a* may include single crystal silicon.

A first surface of the base layer 100*a* is defined as a front side of the base layer 100*a*, and a second surface opposite to the first surface of the base layer 100*a* is defined as a back side of the base layer 100*a*. In an embodiment as shown in FIGS. 1 to 5, the first surface of the base layer 100*a* may be an upper side and the second surface of the base layer 100*a* may be a lower side.

A plurality of active fins 102 may protrude in the vertical direction from the first surface of the base layer 100*a*. The active fins 102 may extend in the second direction. The active fins 102 may be spaced apart from each other in the first direction.

In an embodiment, active fins 102 that are spaced apart from each other in the first direction by a predetermined first interval may form an active fin group. A plurality of active fin groups may be spaced apart by a second interval greater than the first interval.

An isolation pattern 104 may fill a lower portion of a trench between the active fins 102. In an embodiment, upper sidewalls and upper surfaces of the active fins 102 may be exposed by the isolation pattern 104. Upper portions of the active fins 102 may protrude from an upper surface of the isolation pattern 104. In an embodiment, the isolation pattern 104 may include, for example, silicon oxide.

As shown in FIG. 4, the gate structure 112 may extend in the first direction to cross the active fins 102. The plurality of gate structures 112 may have the same width in the second direction to each other, and may be arranged to have regular intervals in the second direction.

The gate structure 112 may have a structure in which a gate insulation layer 112*a*, a gate electrode 112*b*, and a capping pattern 112*c* are stacked. In an embodiment, the gate insulation layer 112*a* may include a silicon oxide layer, a high dielectric layer, or a combination thereof. The high dielectric layer may include a material having a dielectric constant higher than a dielectric constant of the silicon oxide layer. For example, the high dielectric layer may include metal oxide or metal oxynitride. The gate electrode 112*b* may include a metal material. In an embodiment, the capping pattern 112*c* may include silicon nitride or silicon oxynitride.

In an embodiment, as shown in FIG. 4, the gate structure 112 may be formed on sidewalls and upper surfaces of the active fins 102. For example, the gate structure may cover an upper portion of the sidewalls of the active fins 102 and a top surface of the active fins 102. In this embodiment, fin FETs may be formed on the active fins 102.

In an embodiment, as shown in FIG. 5, the active fin 101*a* may include gaps spaced apart from each other in the vertical direction. The gap may pass through the active fin in a horizontal direction. The gate structure 112 may be formed on sidewalk and top surfaces of the active fins 101*a* and inside the gaps. In this embodiment, MBC FETs may be formed on the active fins 101*a*.

Referring to FIGS. 1 to 3, a recess may be formed in the active fin 102 adjacent to both sides of the gate structure 112, and a semiconductor pattern 108 may be formed in the recess. For example, in an embodiment the semiconductor pattern 108 may include silicon or silicon germanium. However, embodiments of the present disclosure are not necessarily limited thereto.

The semiconductor pattern 108 may be doped with impurities. The semiconductor pattern 108 may serve as a source/drain region of the field effect transistor. A sidewall of the semiconductor pattern 108 may protrude further in the first direction than the sidewall of the active fin 102. In a cross-sectional view taken in the first direction, the semiconductor pattern 108 may have a polygonal shape having a protruding central portion, such as a pentagonal shape, a hexagonal shape, or a partial quadrangle shape. However, embodiments of the present disclosure are not necessarily limited thereto.

In an embodiment, portions of sidewalk of adjacent semiconductor patterns 108 may directly contact each other. In this embodiment, each of the semiconductor patterns 108 may be connected to each other in the first direction. However, embodiments of the present disclosure are not necessarily limited thereto. For example, in some embodiments, sidewalls of the semiconductor patterns 108 may not directly contact each other and an entirety of the sidewalk of adjacent semiconductor patterns 108 may be spaced apart from each other.

A first insulating interlayer 110 and a second insulating interlayer 114 may cover the gate structure 112 and the semiconductor pattern 108. The first insulating interlayer 110 may be disposed on (e.g., directly thereon) upper surfaces of the isolation pattern 104. The second insulating interlayer 114 may be disposed directly on an upper surface of the first insulating interlayer 110. The first and second insulating interlayers 110 and 114 may include substantially the same material. In an embodiment, the first and second insulating interlayers 110 and 114 may include silicon oxide.

A buried vertical rail hole 120 may pass through the first and second insulating interlayers 110 and 114, the isolation pattern 104 and the base layer 100*a* (e.g., in the vertical direction). In an embodiment, the buried vertical rail hole 120 may pass through the isolation pattern 104 at a portion of the trench having the second interval between the active fins 102. In an embodiment, the buried vertical rail hole 120 may have a sidewall slope such that an inner width gradually decreases from a top portion to a bottom portion. For example, the buried vertical rail hole 120 may have the sidewall slope such that an inner width gradually decreases from an upper surface of the buried vertical rail hole 120 of the second insulating interlayer 114 towards a lower surface of the base layer 100*a*.

An insulation liner 122 may be formed on a sidewall of the buried vertical rail hole 120, In an embodiment, the insulation liner 122 may include silicon oxide (SiOx), silicon nitride (SiN), or silicon oxycarbonitride (SiOCN). However, embodiments of the present disclosure are not necessarily limited thereto.

A first barrier pattern 124*b* may be formed on the insulation liner 122. The first barrier pattern 124*b* may be formed on the sidewall of the buried vertical rail hole 120.

A first metal pattern 126*a* may be formed on the first barrier pattern 124*b* (e.g., an inner surface of the first barrier pattern 124*b*) to fill the buried vertical rail hole 120. The first barrier pattern 124*b* may be formed only on a sidewall of the first metal pattern 126*a*, and may surround the sidewall of the first metal pattern 126*a*. The first barrier pattern 124*b* may not be formed on a bottom surface of the first metal pattern 126*a*.

A buried vertical rail 130*a* including the first barrier pattern 124*b* and the first metal pattern 126*a* may be formed in the buried vertical rail hole 120. The buried vertical rail 130*a* may extend in the vertical direction to pass through the first and second insulating interlayers 110 and 114, the isolation pattern 104 and the base layer 100*a*. The insulation liner 122 may surround an outer wall of the buried vertical rail 130*a* and may be disposed between the buried vertical rail 130*a* and the base layer 100*a*. The base layer 100*a* and the buried vertical rail 130*a* may be insulated from each other by the insulation liner 122.

In an embodiment, the first barrier pattern 124*h* may include, for example, Ti, Ta TiN, TaN, or a combination thereof. The first metal pattern 126*a* may include, for example, Cu, W, Mo, Ru, or Nb.

A third insulating interlayer 134 may cover the second insulating interlayer 114 and the buried vertical rail 130*a*. For example, the third insulating interlayer 134 may directly contact an upper surface of the second insulating interlayer 114, A first contact plug 140 may be formed in the first to third insulating interlayers 110, 114, and 134 to be electrically connected with an upper portion of the semiconductor pattern 108 and an upper portion of the buried vertical rail 130*a*. The first contact plug 140 may directly contact at least a portion of the upper portion of the semiconductor pattern 108 serving as the impurity region and at least a portion of the upper portion of the buried vertical rail 130*a* to electrically connect the buried vertical rail 130*a* and the impurity regions. The first contact plug 140 may include the second barrier pattern 140*a* and the second metal pattern 140*b*. A lower portion of the sidewall of the second barrier pattern 140*a* may directly contact the first insulating interlayer 110, a central portion of the sidewall of the second barrier pattern 140*a* may directly contact the second insulating interlayer 114 and an upper portion of the sidewall of the second barrier pattern 140*a* may directly contact the third insulating interlayer 134.

In some embodiments, a second contact plug may be further formed on the gate electrode 112*b* in the gate structure 112. The second contact plug may be electrically connected to the gate electrode 112*b* in the gate structure 112. However, embodiments of the present disclosure are not necessarily limited thereto and three or more contact plugs may be further formed on the gate electrode 112*b* in some embodiments.

An etch stop layer 200 and a first lower insulating interlayer 202 may be formed on the second surface of the base layer 100*a*. A first lower contact plug 230 may pass through the first lower insulating interlayer 202 and the etch stop layer 200, and thus the first lower contact plug 230 may directly contact the buried vertical rail 130*a*, such as a lower portion of the buried vertical rail 130*a*. The first lower contact plug 230 may till a first hole 210*a* passing through the first lower insulating interlayer 202 and the etch stop layer 200. However, embodiments of the present disclosure are not necessarily limited thereto. For example, in some example embodiments, the etch stop layer 200 may not be formed.

The first lower contact plug 230 may include a third barrier pattern 212*a* and a third metal pattern 220. The third barrier pattern 212*a* may be formed on a sidewall of the first hole 210*a*, and the third metal pattern 220 may be formed on the third barrier pattern 212*a* to fill the first hole 210*a*. The third barrier pattern 212*a* may surround a sidewall of the third metal pattern 220.

In an embodiment, the third barrier pattern 212*a* may include, for example, Ti, Ta, TiN, TaN, or a combination thereof. The third metal pattern 220 may include, for example, Cu, W, Mo, Ru, or Nb.

As shown in FIGS. 2A and 2B, a top surface of the third metal pattern 220 may directly contact a bottom surface of the first metal pattern 126*a*. Therefore, a barrier pattern ay not be formed between the top surface of the third metal pattern 220 and the bottom surface of the first metal pattern 126*a*. Accordingly, a contact resistance between the buried vertical rail 130*a* and the first lower contact plug 230 may be decreased.

A contact surface between the buried vertical rail 130*a* and the lower contact plug 230*a* may not be coplanar with the lower surface (e.g., the second surface) of the base layer 100*a*. For example, the contact surface between the buried vertical rail 130*a* and the lower contact plug 230*a* may be located on a plane that is different from the bottom surface of the base layer 100*a*. In an embodiment, the contact surface between the buried vertical mil 130*a* and the lower contact plug 230*a* may be higher than the lower surface of the base layer 100*a*. A portion (e.g., interface) between the third metal pattern 220 and the first metal pattern 126*a* in which the third metal pattern 220 and the first metal pattern 126*a* directly contact each other may be higher than the lower surface of the base layer 100*a*.

In an embodiment, the first lower contact plug 230 may be vertically aligned with the buried vertical rail 130*a*.

As shown in FIG. 2A, an upper surface of the first lower contact plug 230 and a lower surface of the buried vertical rail 130*a* may have the same or similar areas as each other. For example, in an embodiment the upper surface of the first lower contact plug 230 and the lower surface of the buried vertical rail 130*a* may completely overlap (e.g., in the vertical direction), and may directly contact each other.

As shown in FIG. 2B, an area of an upper portion of the first lower contact plug 230 may be greater than an area of a lower portion of the buried vertical rail 130*a*. In this embodiment, a barrier layer may not be formed at a contacting portion in which a top surface of the third metal pattern 220 and a bottom surface of the first metal pattern 126*a* directly contact each other. However, the third barrier pattern 212*a* may remain on a portion below the contacting portion in which the upper surface of the third metal pattern 220 is not in direct contact with the first metal pattern 126*a*. The first barrier pattern 124*b* may extend below the contacting portion and the first metal pattern and may directly contact an upper surface of the third barrier pattern 212*a*. In an embodiment, an additional insulation liner 122*a* may be further formed to surround an outer surface of the first lower contact plug 230.

A fourth insulating interlayer 150 may be formed on (e.g., disposed directly thereon) the third insulating interlayer 134, the first contact plug 140 and the second contact plug. A first upper wiring 152 for transmitting signals may be formed inside and on the fourth insulating interlayer 150 to be electrically connected to the field effect transistor. In an embodiment, the first upper wiring 152 may be electrically connected to the first and second contact plugs.

A first upper insulating interlayer 160 may cover the first upper wirings 152, The first upper wirings 152 may be multilayer wirings. While an embodiment of FIG. 1 shows two layers of wirings for the first upper wirings 152, embodiments of the present disclosure are not necessarily limited thereto and the number of layers may vary. The first upper wirings 152 may include contact plugs and conductive lines. The first upper wirings 152 may include a metal material. In an embodiment, the first upper wirings 152 may include, for example, Cu, W, Mo, Ru, or Nb.

The first upper wirings 152 may be positioned on the first surface (e.g., the front side) of the base layer 100*a*. The first upper wirings 152 may apply signals to circuit elements formed on the base layer 100*a*.

A second lower insulating interlayer 240 and a first lower wiring 242 are formed on (e.g., disposed directly thereon) a lower surfaces of the first lower insulating interlayer 202 and the first lower contact plug 230. The first lower wiring 242 may be disposed in the second lower insulating interlayer 240.

The first lower wirings 242 may be multi-layer wirings. While an embodiment of FIG. 1 shows three layers of wirings for the first lower wirings 242, embodiments of the present disclosure are not necessarily limited thereto and the number of layers may vary. The first lower wirings 242 may include contact plugs and conductive lines. The first lower wirings 242 may include a metal material. In an embodiment, the first lower wirings 242 may include, for example, Cu, W, Mo, Ru, or Nb. The first lower wirings 242 may be electrically connected to the first lower contact plug 230.

The first lower wirings 242 may be formed on the second surface (e.g., the back side) of the base layer 100*a*. The first lower wirings 242 may apply power to the circuit elements formed on the base layer 100*a*, In an embodiment, the first lower wiring 242 may include a barrier pattern and a metal pattern.

In an embodiment embodiments, a protective layer may be formed on an uppermost insulating interlayer.

FIGS. 6 to 24 are plan views and cross-sectional views illustrating a method of manufacturing a semiconductor device in accordance with some example embodiments.

Figure 7:
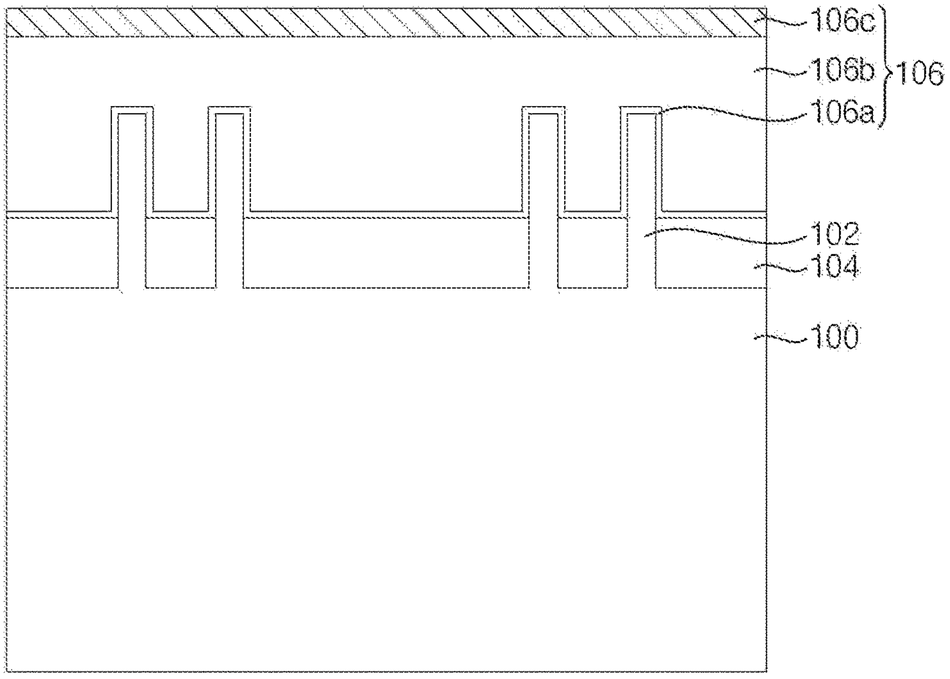
Figure 8:
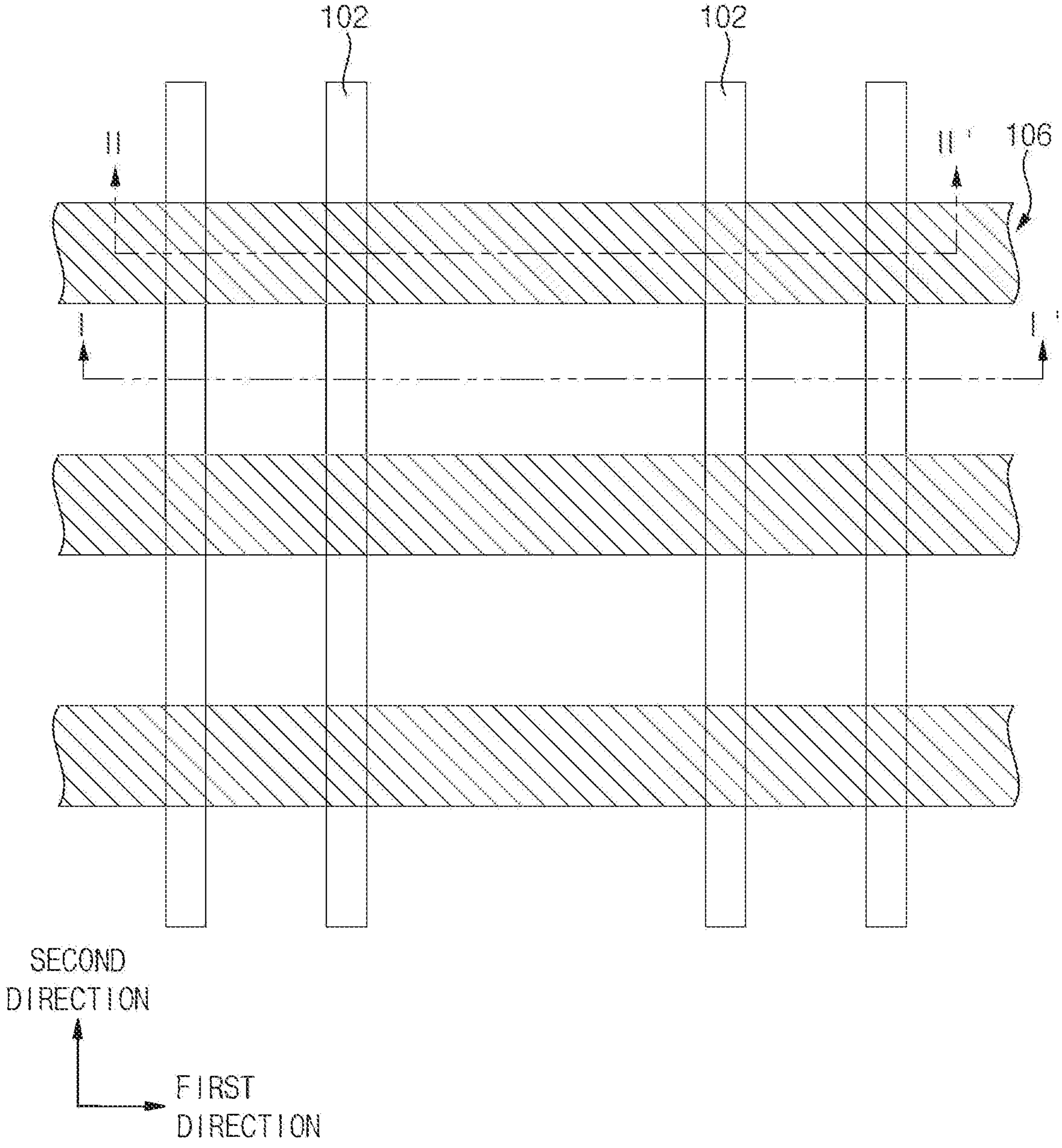
Figure 14:
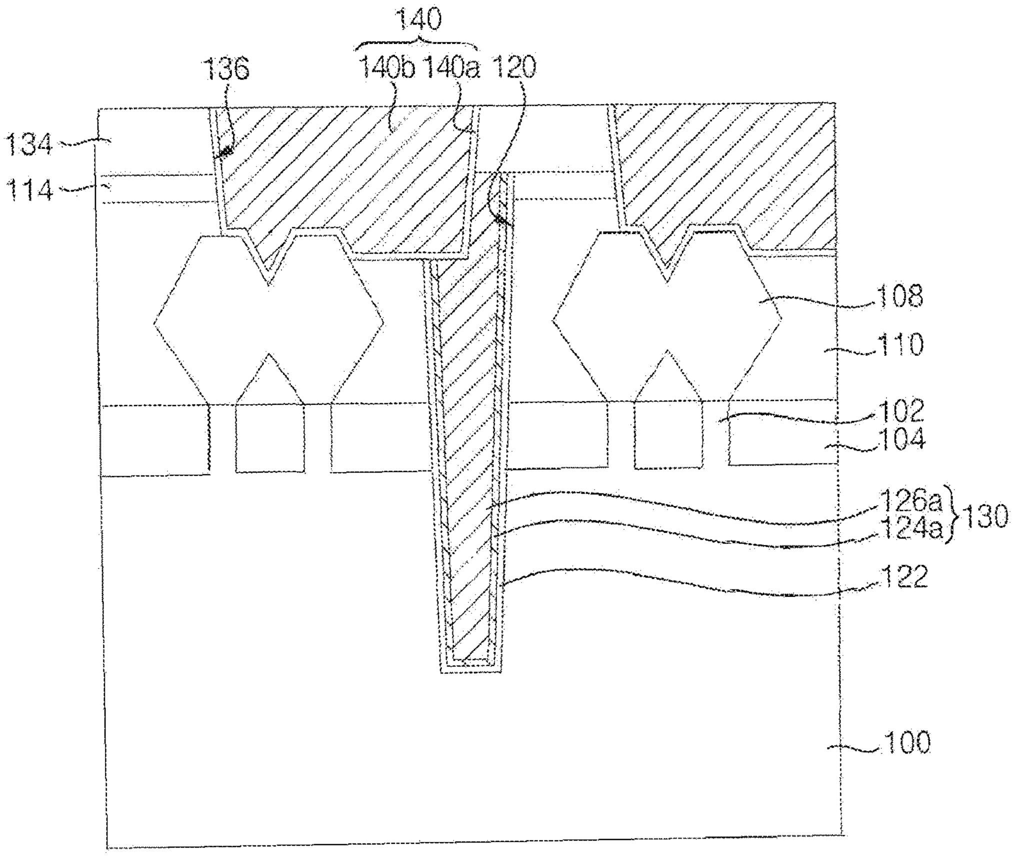
Figure 15:
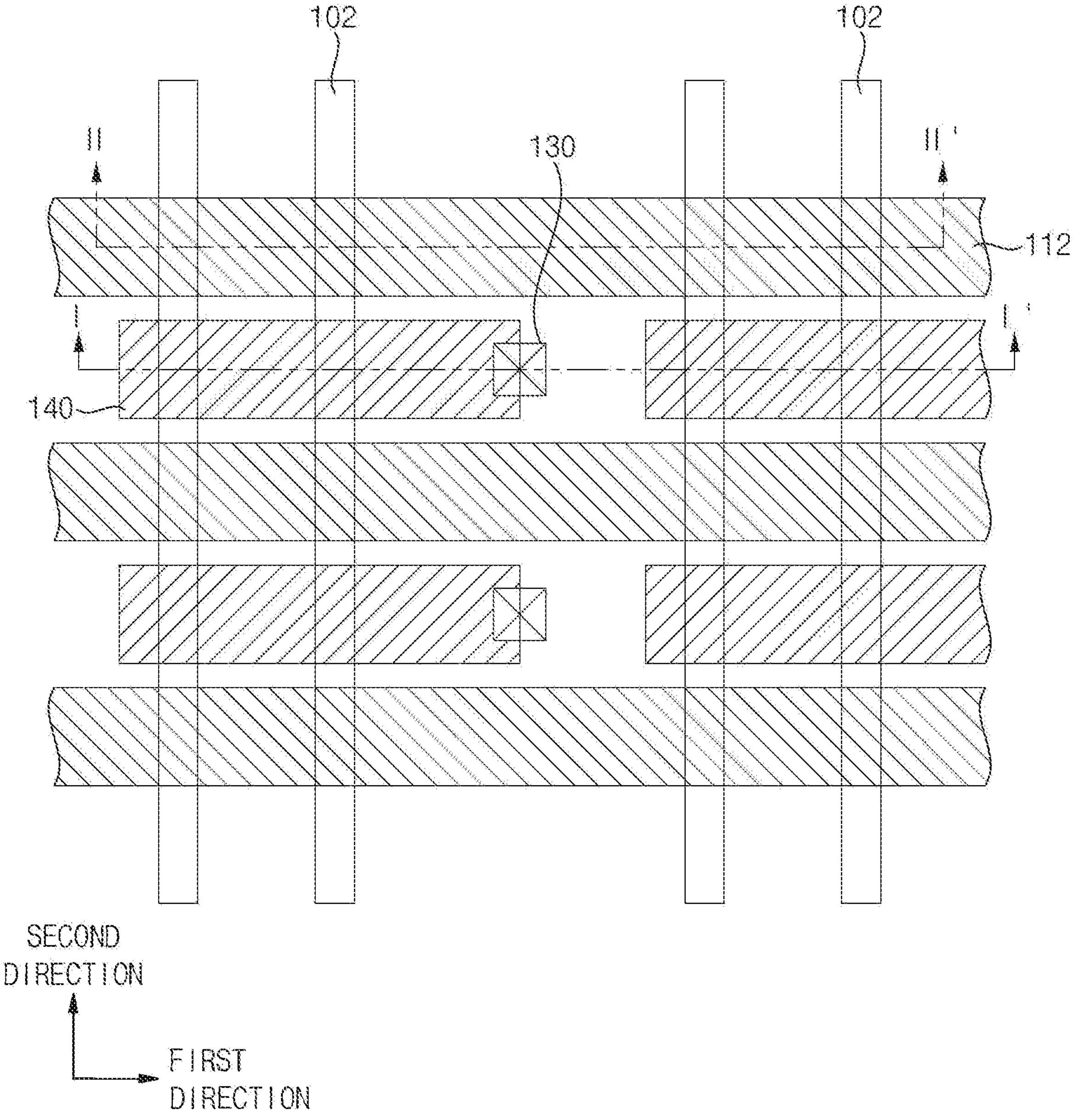

FIGS. 8 and 15 are plan views. FIGS. 6, 9, 11 to 14, and FIGS. 16 to 24 are cross-sectional views taken along line of FIG. 8. FIGS. 7 and 10 are cross-sectional views taken along line II-II' of FIG. 8.

Hereinafter, a method of manufacturing a semiconductor device including a fin FET is described.

Figure 6:
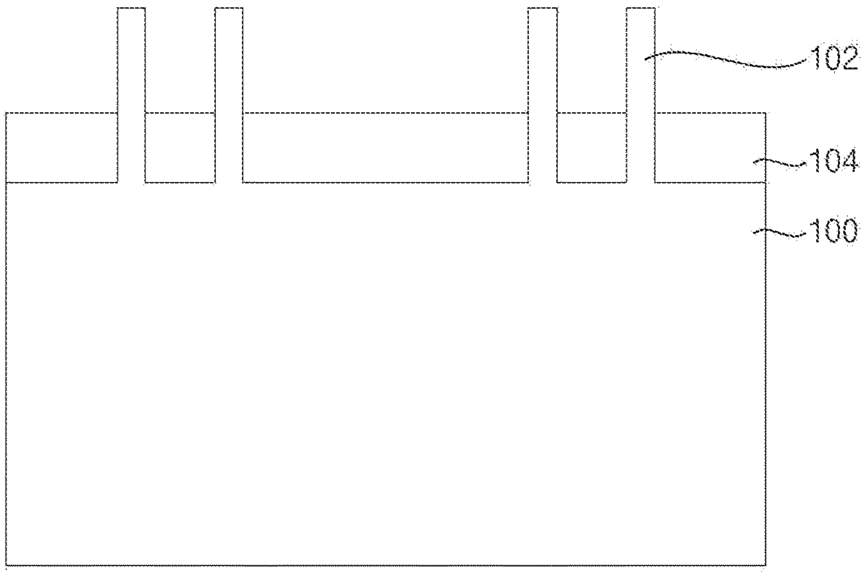

Referring to FIG. 6, a portion of a substrate 100 may be etched to form a plurality of active fins 102 that protrude from an upper surface of the substrate 100 in the vertical direction and extend in the second direction. In an embodiment, the substrate 100 may include a semiconductor material. For example, the substrate 100 may include single crystal silicon. The active fins 102 that are spaced apart from each other in the first direction by the first interval may form an active fin group. A plurality of active fins group may be spaced apart to each other by a second interval that is greater than the first interval.

An isolation layer covering the active fins 102 may be formed to completely fill a space between the active fins 102. In an embodiment, the isolation layer may include, for example, silicon oxide.

An upper portion of the isolation layer may be partially etched to expose upper sidewalk and upper surfaces of the active fins 102 to form isolation patterns 104. Accordingly, upper portions of the active fins 102 may protrude from the surface of the isolation pattern 104.

Referring to FIGS. 7 and 8, dummy gate structures 106 may be formed on the active fins 102 and the isolation pattern 104 so as to cross the active fins 102. The dummy gate structures 106 may extend in the first direction. In an embodiment, the dummy gate structures 106 may include a dummy gate insulation layer 106*a*, a dummy gate pattern 106*b*, and a dummy capping pattern 106*c* sequentially stacked. In an embodiment, spacers may be formed on both sides of the dummy gate structure 106.

Figure 9:
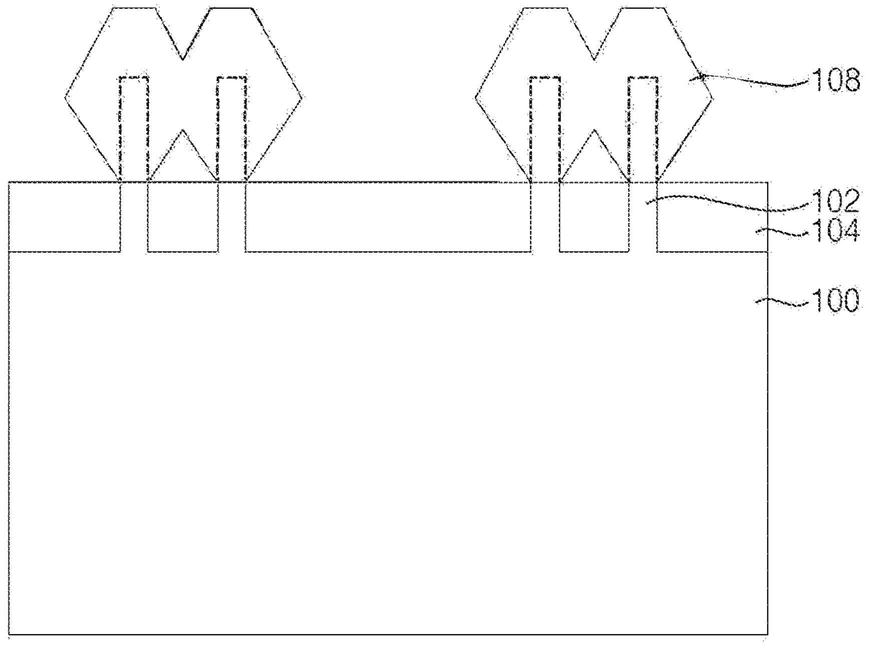
Figure 10:
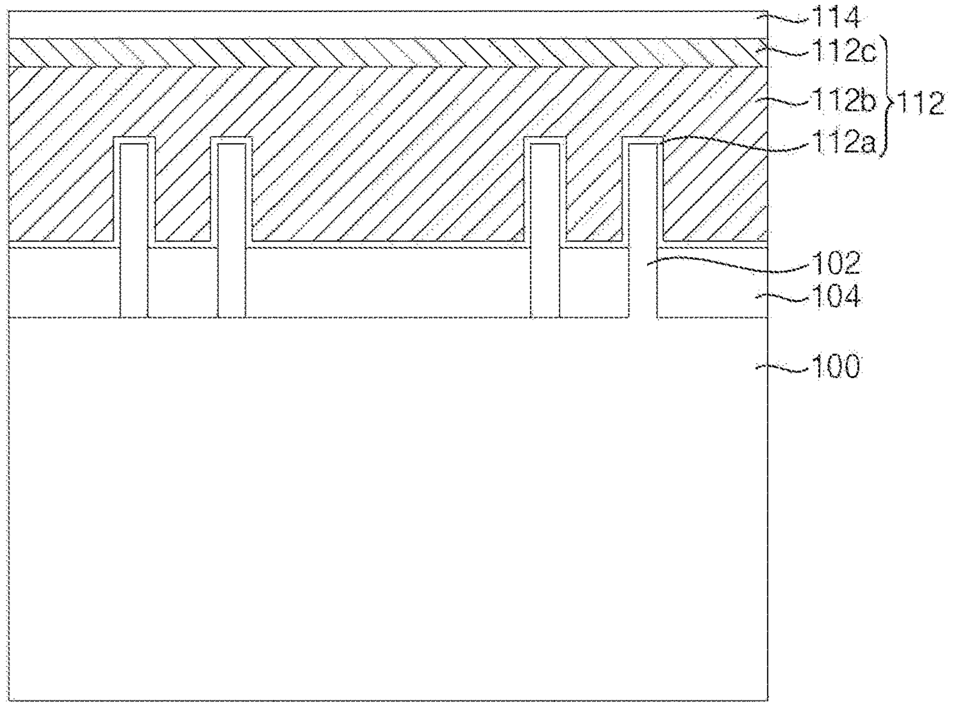

Referring to FIG. 9, upper portions of the active fins 102 adjacent to both sides of the dummy gate structure 106 may be etched to form recesses. A selective epitaxial growth process may be performed to grow a semiconductor material from the active fins 102 of a bottom surface of the recess. Thus, a semiconductor pattern 108 may be formed in the recess. For example, in an embodiment the semiconductor pattern 108 may include silicon or silicon germanium.

The semiconductor pattern 108 may be doped with impurities. The semiconductor pattern 108 may serve as a source/drain region of a fin FET. A sidewall of the semiconductor pattern 108 may protrude more in the first direction than a sidewall of the active fins 102. In an embodiment, in a cross-sectional view taken in the first direction, the semiconductor pattern 108 may have a polygonal shape having a protruding central portion, such as a pentagonal shape, a hexagonal shape, or a partial quadrangle shape.

Figure 11:
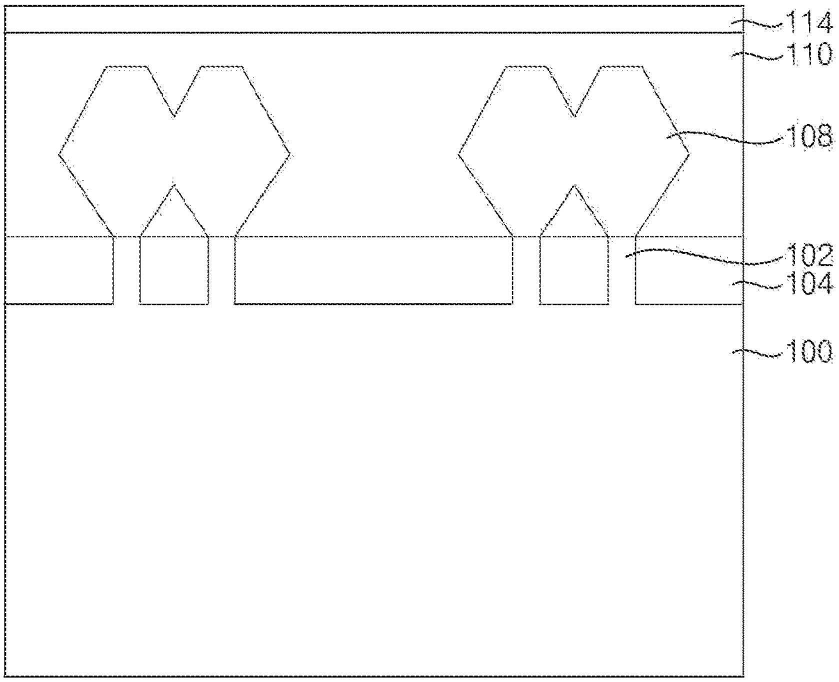

Referring to FIGS. 10 and 11, a first insulating interlayer 110 may be formed to cover the dummy gate structure 106 and the semiconductor pattern 108. The first insulating interlayer 110 may be planarized until an upper portion of the dummy gate structure 106 may be exposed. In an embodiment, the first insulating interlayer 110 may include silicon oxide.

The dummy gate structure 106 may be removed to form a first trench. A gate structure 112 may be formed in the first trench. As shown in MG. 10, in an embodiment the gate structure 112 may include a gate insulation layer 112*a*, a gate electrode 112*b* and a capping pattern 112*c*.

A second insulating interlayer 114 may be formed on the first insulating interlayer 110. In an embodiment, the first and second insulating interlayers 110 and 114 may include substantially the same material.

Figure 12:
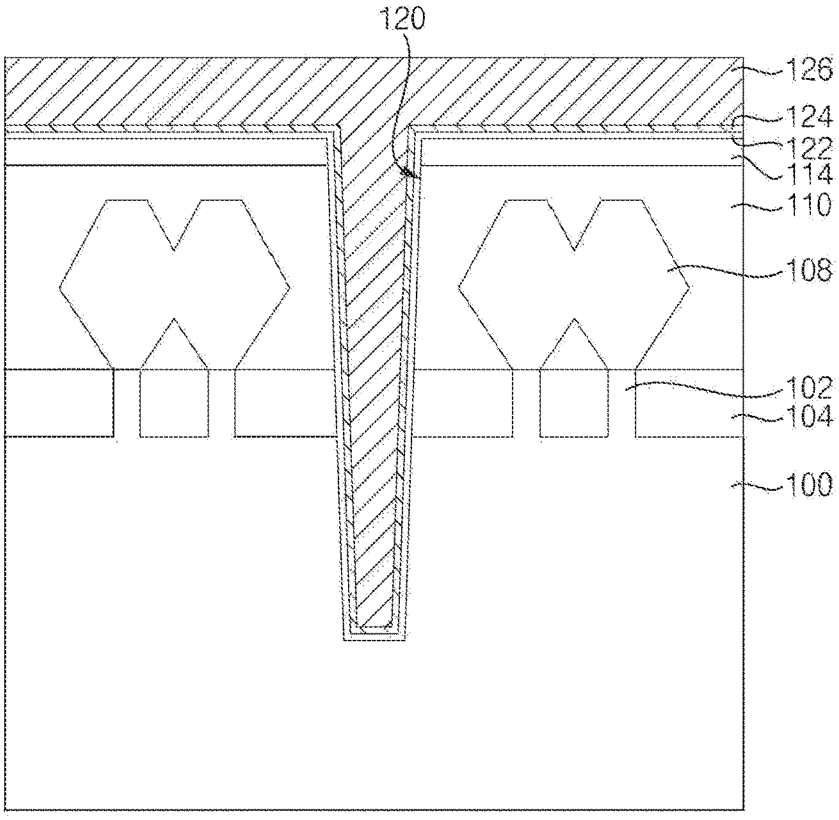
Figure 13:
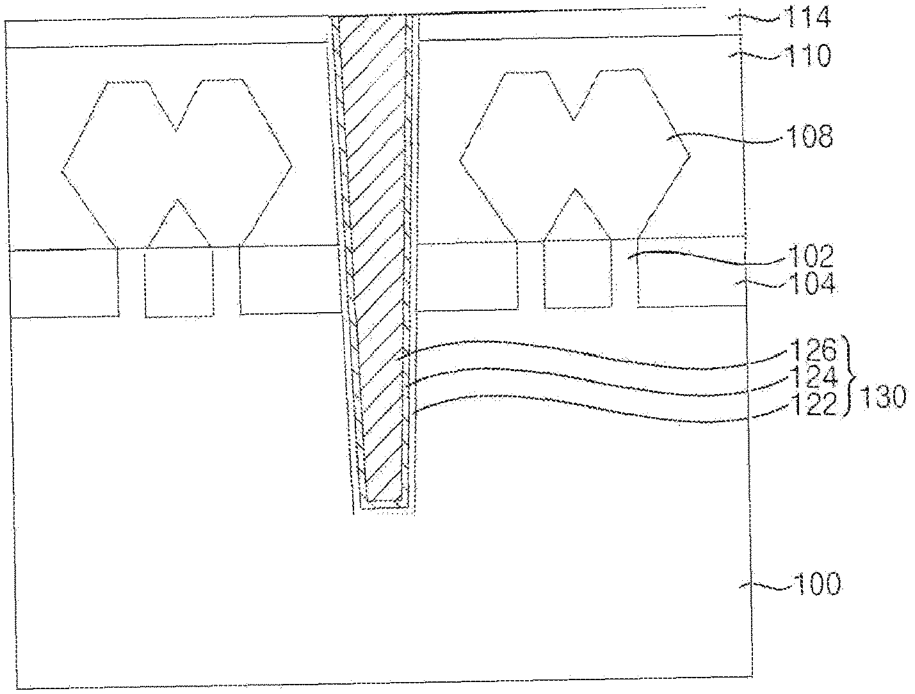

Referring to FIG. 12, a buried vertical rail hole 120 may be formed through the first and second insulating interlayers 110 and 114 and the isolation pattern 104, and may extend to an inner portion of the substrate 100. In some example embodiments, the buried vertical rail hole 120 may be formed to pass through a portion of the isolation pattern 104 having the second interval between the active fins.

In an embodiment, the buried vertical rail hole 120 may be formed by a dry etching process. Due to a nature of the dry etching process, the buried vertical rail hole 120 may have a sidewall slope such that an inner width gradually decreases from a top portion of the buried vertical rail hole 120 towards a bottom portion of the buried vertical rail hole 120.

An insulation liner 122 may be formed along a sidewall and bottom surface of the buried vertical rail hole 120 and an upper surface of the second insulating interlayer 114. In an embodiment, the insulation liner 122 may include, for example, silicon oxide (SiOx), silicon nitride (SiN), or silicon oxycarbonitride (SiOCN).

A first preliminary barrier layer 124 may be formed on the second insulating interlayer 114 along a surface profile of the buried vertical rail hole 120. A first metal layer 126 may be formed on the first preliminary barrier layer 124 to fill the buried vertical rail hole 120.

In an embodiment, the first preliminary barrier layer 124 may be formed of, for example, Ti, Ta, TiN, TaN, or a combination thereof. The first metal layer 126 may be formed of, for example, Chu, W, Mo, Ru, or Nb.

Referring to HQ 13, the first preliminary barrier layer 124, the first metal layer 126, and the insulation liner 122 may be planarized until an upper surface of the second insulating interlayer 114 may be exposed to form a preliminary buried vertical rail 130 in the buried vertical rail hole 120. In an embodiment, the preliminary buried vertical rail 130 may include a first preliminary barrier pattern 124*a* and a first metal pattern 126*a*.

Referring to FIGS. 14 and 15, a third insulating interlayer 134 may be formed to cover the second insulating interlayer 114 and the preliminary buried vertical rail 130.

Portions of the first to third insulating interlayers 110, 114 and 134 may be etched to form a first contact hole 136 exposing at least portion of an upper surface of the semiconductor pattern 108 and at least portion of an upper portion of the preliminary buried vertical rail 130. In the process of forming the first contact hole 136, an upper portion of the preliminary buried vertical rail 130 may be partially removed.

In some example embodiments, a portion of the capping pattern 112*c* of the gate structure 112 may be further etched to form a second contact hole exposing the upper surface of the gate electrode 112*b*.

A first contact plug 140 may be formed in the first contact hole 136. In addition, a second contact plug may be formed in the second contact hole. The first contact plug 140 may directly contact the semiconductor pattern 108 and the preliminary buried vertical rail 130, respectively. Accordingly, the first contact plug 140 may be electrically connected with the semiconductor pattern 108 and the preliminary buried vertical rail 130. In an embodiment, the first contact plug 140 may include a metal material.

In some example embodiments, a second barrier layer may be formed along surfaces of the first contact hole 136 and the second contact hole and an upper surface of the third insulating interlayer 134. A second metal layer may be formed on the second barrier layer to fill the first contact hole 136 and the second contact hole. Thereafter, the second barrier layer and the second metal layer may be planarized until the upper surface of the third insulating interlayer 134 may be exposed to form the first contact plug 140 filling the first contact hole 136 and the second contact plug filling the second contact hole. In an embodiment, each of the first contact plug 140 and the second contact plug may include a second barrier pattern 140*a* and a second metal pattern 140*b*.

Figure 16:
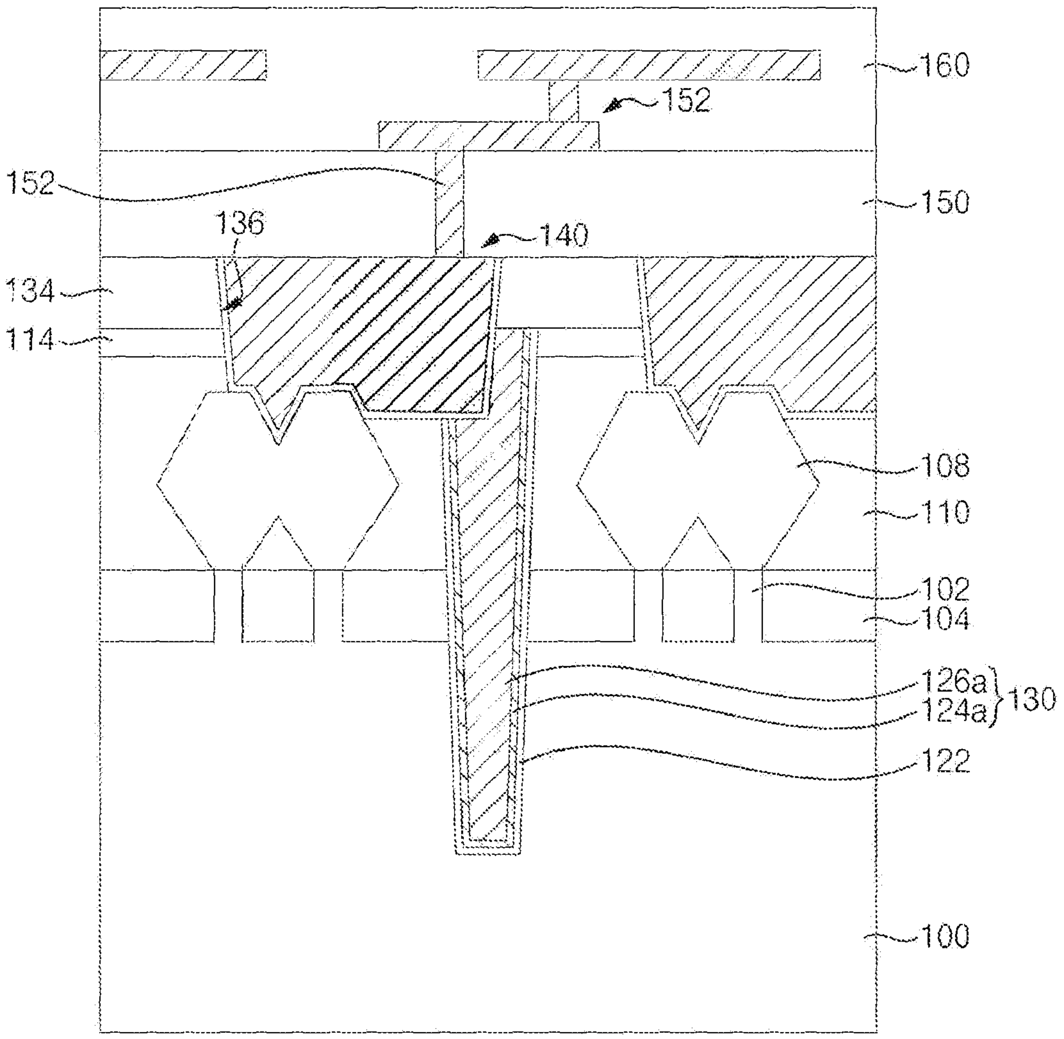

Referring to FIG. 16, a fourth insulating interlayer 150 may be formed on the third insulating interlayer 134, the first contact plug 140 and the second contact plug. First upper wirings 152 electrically connected to the first and second contact plugs may be formed on the first contact plug 140 and the second contact plug and inside of the fourth insulating interlayer 150. A first upper insulating interlayer 160 may be formed on the fourth insulating interlayer 150 and may cover the first upper wirings 152.

In an embodiment, the first upper wirings 152 may be formed as multilayer wirings. The first upper wirings 152 may include contact plugs and conductive lines. The first upper wirings 152 may include a metal material. The first upper wirings 152 may include, for example, Cu, W, Mo, Ru, or Nb.

The first upper wirings 152 may be positioned on the front side of the substrate 100 (e.g., a base layer). The first upper wirings 152 may apply signals to the circuit elements (e.g., field effect transistors) formed on the substrate 100.

Figure 17:
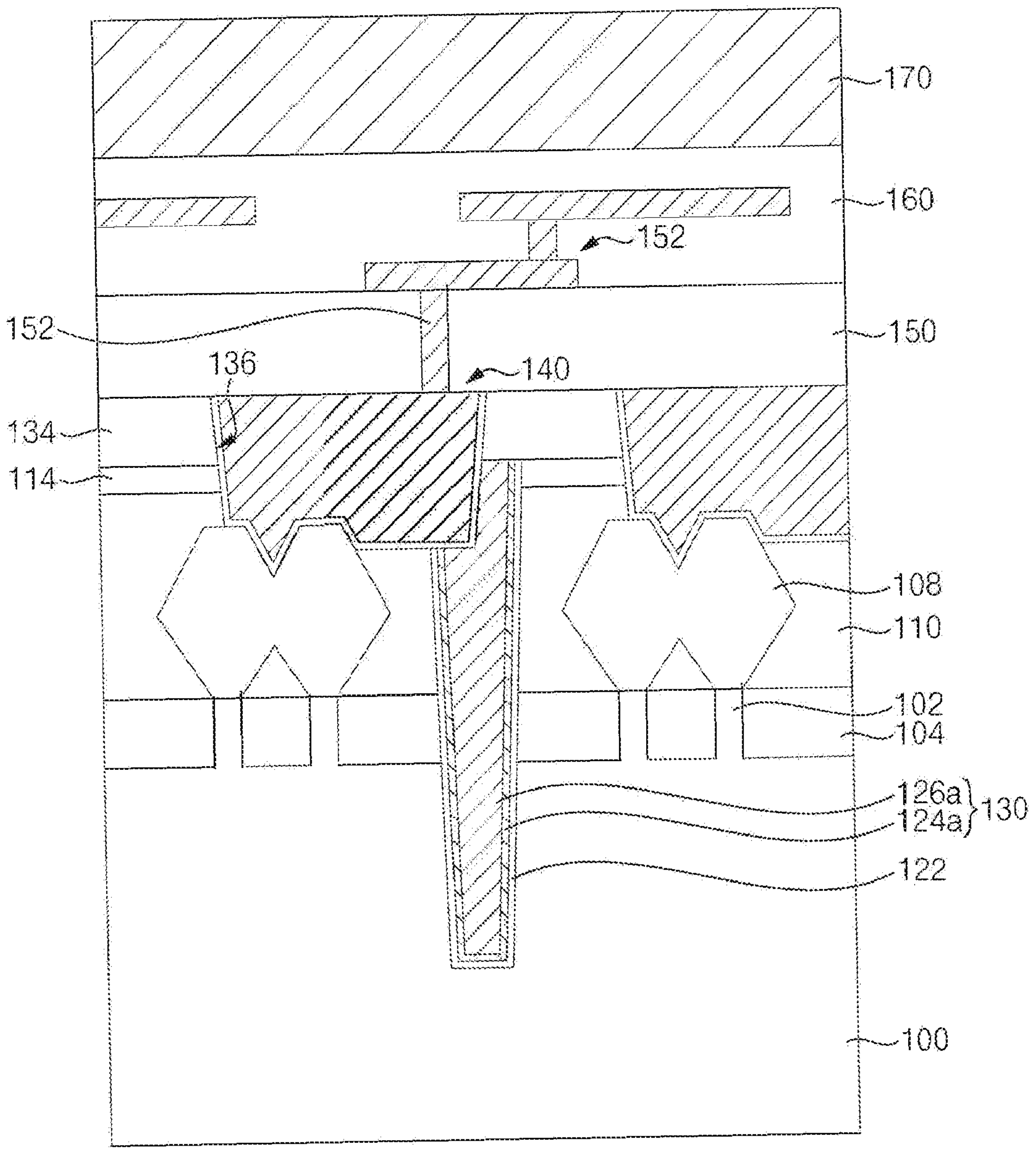

Referring to FIG. 17, an insulation bonding layer may be formed on the first upper insulating interlayer 160.

A carrier substrate 170 may be attached on the insulation bonding layer. In an embodiment, the carrier substrate 170 may be, for example, a semiconductor wafer, a ceramic substrate, or a glass substrate.

Figure 18:
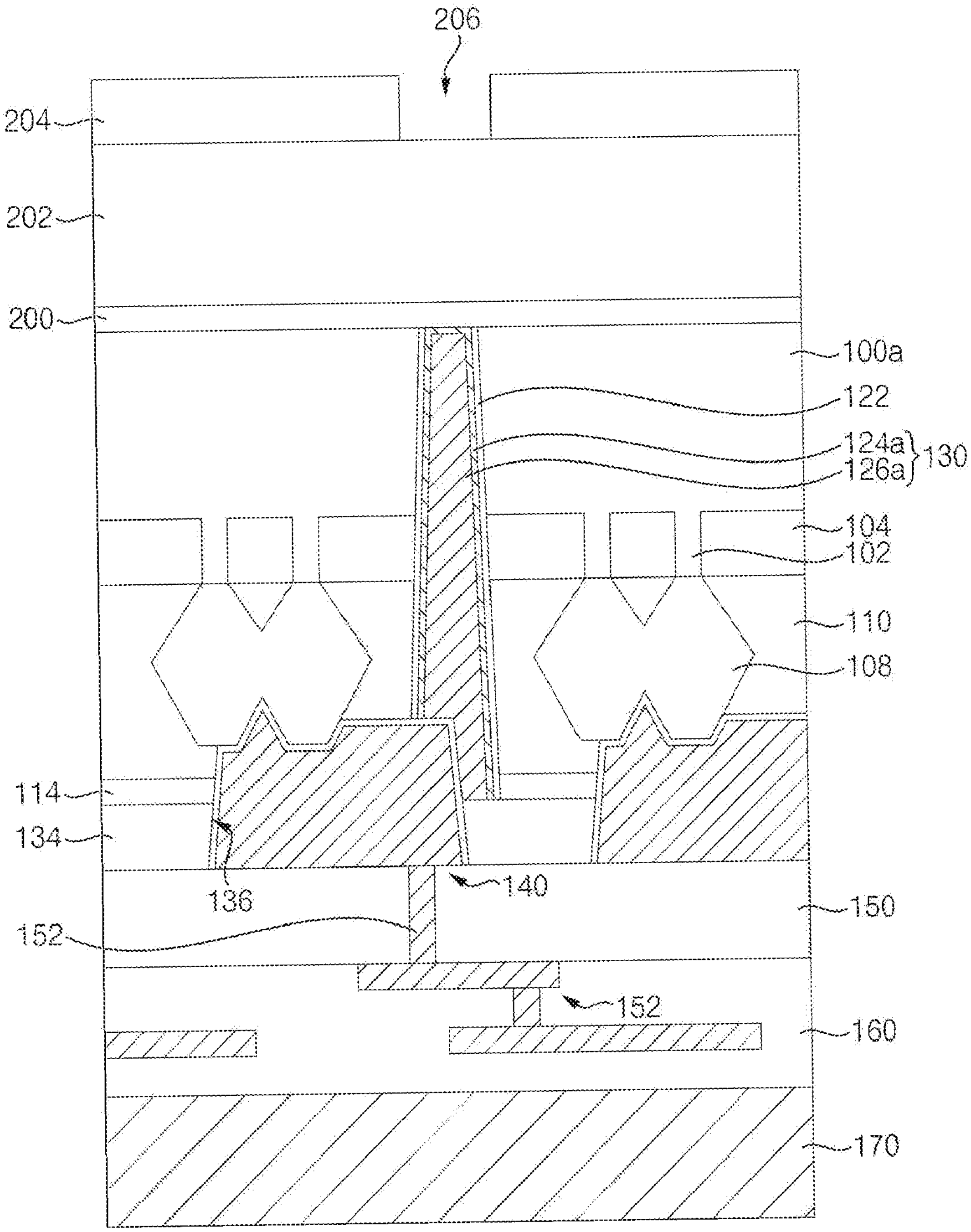

Referring to FIG. 18, the substrate 100 may be rotated 180 degrees so that the carrier substrate 170 may be positioned below. Accordingly, a back side surface of the substrate 100 may be positioned on an uppermost portion from the carrier substrate 170. Hereinafter, a portion close to the carrier substrate 170 is referred to as a lower portion, and a portion close to the back side surface of the substrate 100 is referred to as an upper portion.

The back side surface of the substrate 100 may be removed until the first preliminary barrier pattern 124*a* of the preliminary buried vertical rail 130 may be exposed to form a base layer 100*a* having thin thickness. In the removing process of the back side surface of the substrate 100, the insulation liner 122 positioned on an upper portion of the preliminary buried vertical rail 130 may be removed.

In an embodiment, the substrate 100 may be removed by a predetermined thickness through a back grinding process or a backlap process. Thereafter, the back side surface of the substrate may be further removed to expose the preliminary buried vertical rail 130 by a chemical mechanical polishing (CHIP) process, an etch-back process, or a combination thereof to form the base layer 100*a*.

Thereafter, an etch stop layer 200 and a first lower insulating interlayer 202 may be formed on the base layer 100*a*.

In some example embodiments, the etch stop layer 200 may include AlN. The first lower insulating interlayer 202 may include silicon oxide.

A first photoresist pattern 204 including an opening 206 opposite to the upper surface of the preliminary buried vertical rail 130 may be formed on the first lower insulating interlayer 202. The opening 206 may be vertically aligned with the preliminary buried vertical rail 130. For example, the opening 206 may overlap the preliminary buried vertical rail 130 in the vertical direction.

In the process of forming the first photoresist pattern 204, the preliminary buried vertical rail 130 may be used as an align key. For example, the first lower insulating interlayer 202 may have relatively excellent light transmission properties, so that the preliminary buried vertical rail 130 extending through the base layer 100*a* may serve as an align key.

Figure 19:
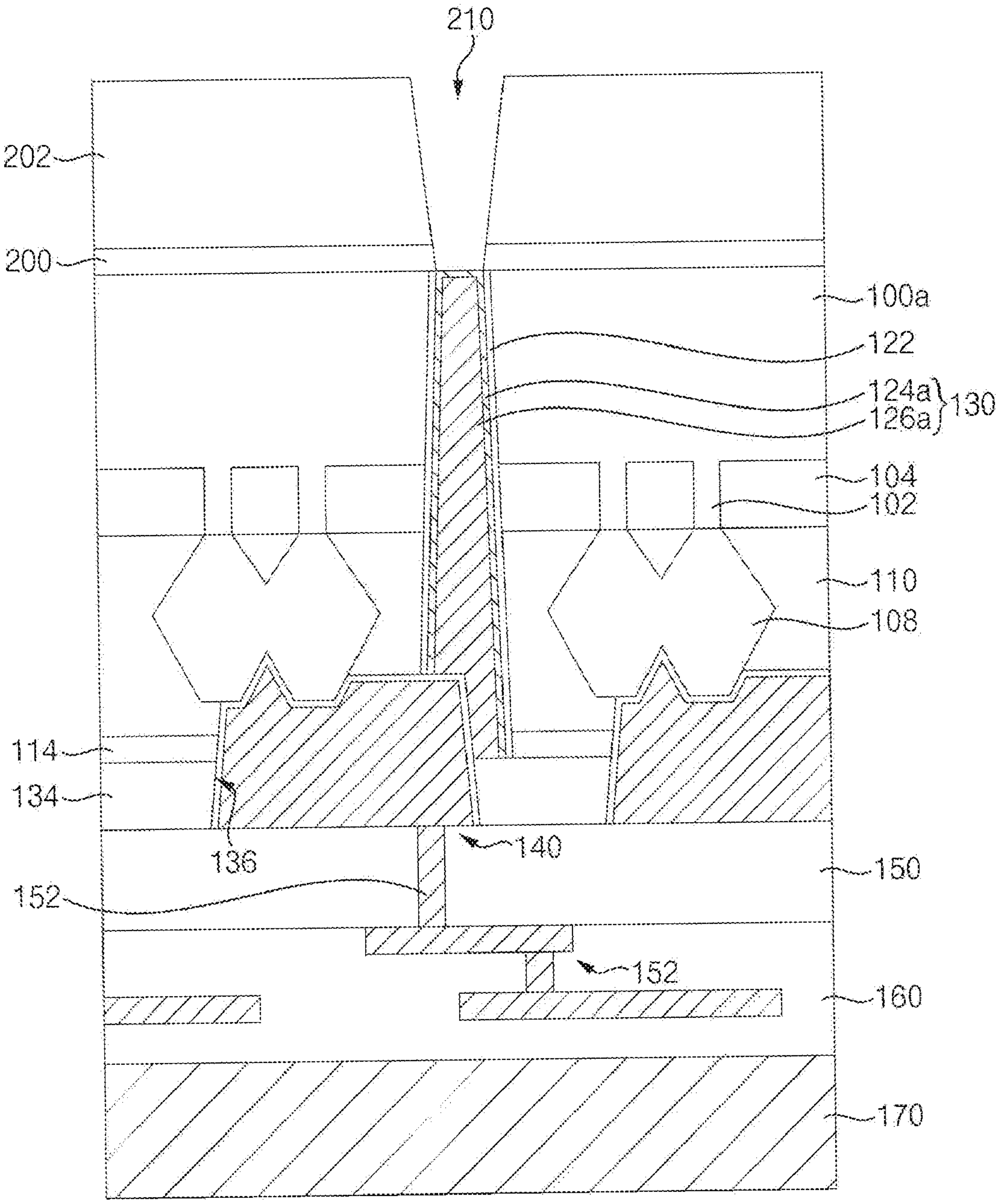

Referring to FIG. 19, the first lower insulating interlayer 202 and the etch stop layer 200 may be etched using the first photoresist pattern 204 as an etching mask to form a first preliminary hole 210. A first preliminary barrier pattern 124*a* of the preliminary buried vertical rail 130 may be exposed by a bottom of the first preliminary hole 210.

Figure 20:
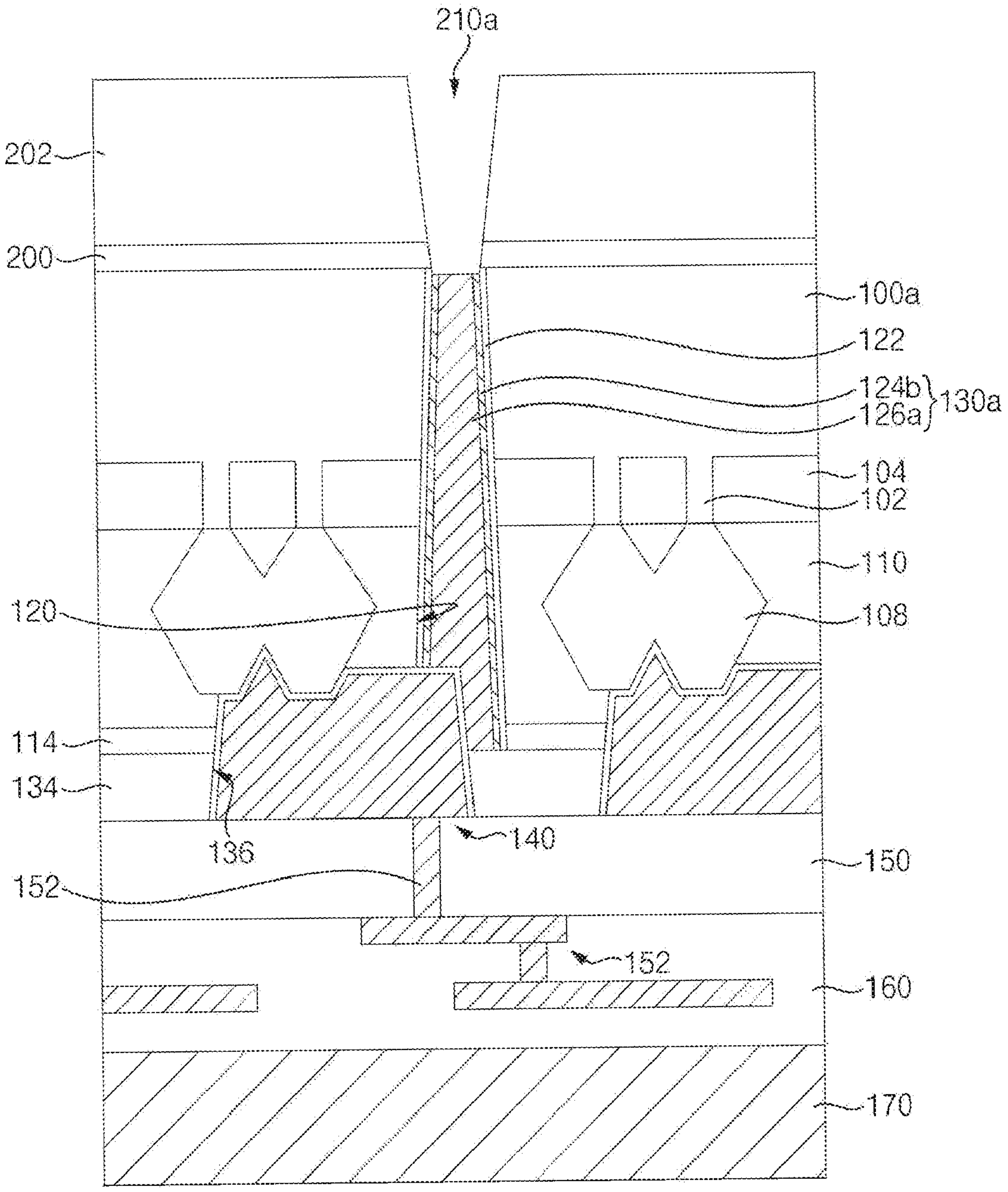

Referring to FIG. 20, the first preliminary barrier pattern 124*a* exposed by the bottom of the first preliminary hole 210 may be removed to form a first hole 210*a* and the first barrier pattern 124*b*. Accordingly, a buried vertical rail 130*a* including a first barrier pattern 124*b* and a first metal pattern 126*a* may be formed in the buried vertical rail hole 120. The first metal pattern 126*a* may be exposed by a bottom of the first hole 210*a*.

As the first preliminary barrier pattern 124*a* exposed by the bottom of the first preliminary hole 210 is removed, the bottom of the first hole 210*a* may be positioned lower than an upper surface of the base layer 100*a*.

In some example embodiments, the process of removing the first preliminary barrier pattern 124*a* may include an inductively coupled plasma (ICP) etching process. In an embodiment in which the inductively coupled plasma etching process is performed, an etching rate and an etching direction may be easily controlled. Thus, the first preliminary barrier pattern 124*a* of a desired portion may be removed.

For example, the first preliminary barrier pattern 124*a* may be etched by argon plasma. By applying RF power to the ICP coil, the argon plasma may be generated. Argon ions may be accelerated by an electric field toward the first preliminary barrier pattern 124*a*. The accelerated argon ions may be bombarded to the first preliminary barrier pattern 124*a*, so that the first preliminary barrier pattern 124*a* may be removed. In this embodiment, since the argon ions may be attracted in the vertical direction, the sidewall of the first hole 210*a* may be hardly etched due to a bombardment of the argon ions. Accordingly, the first preliminary barrier pattern 124*a* exposed by the bottom of the first preliminary hole 210 may be selectively etched.

Figure 21:
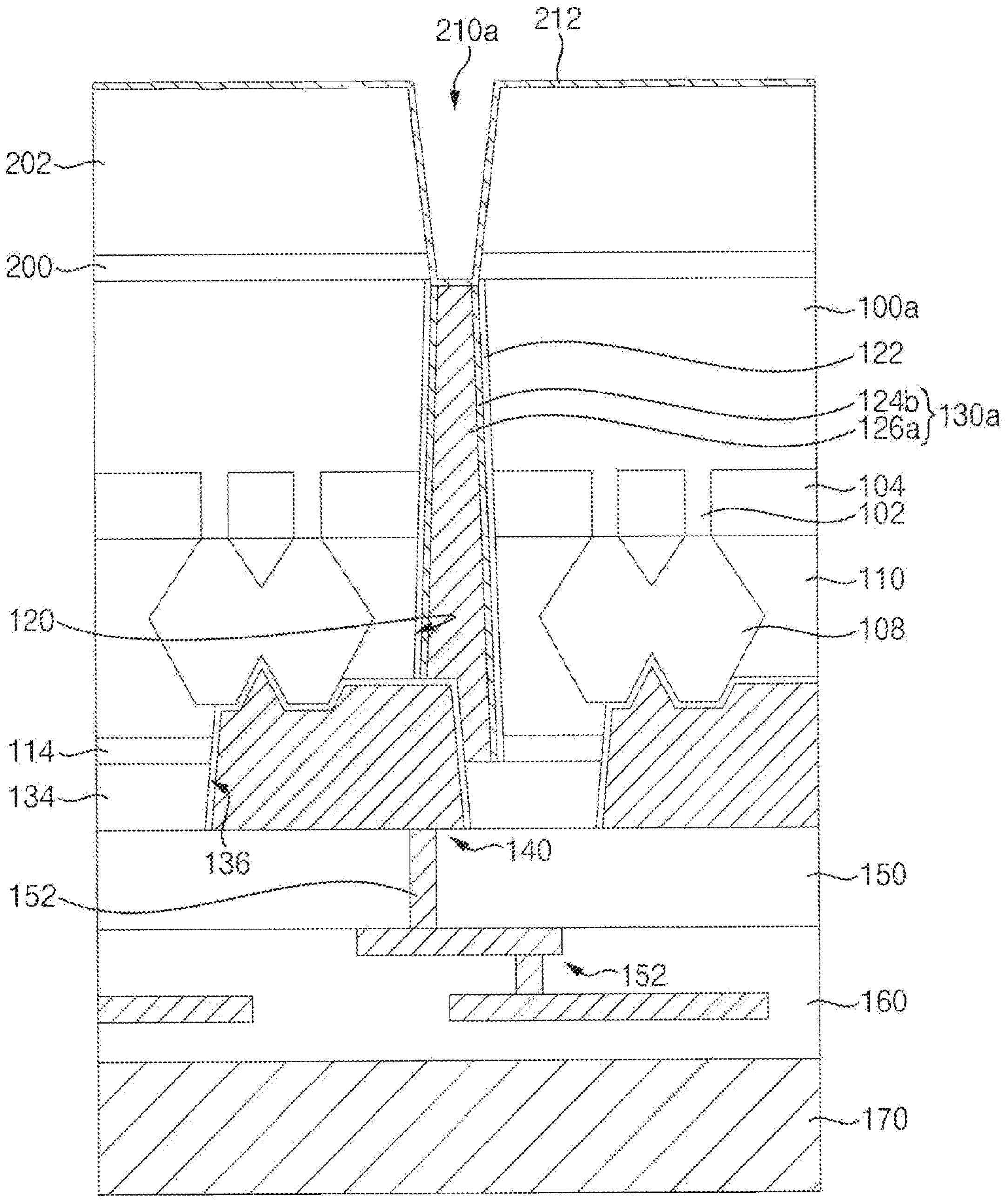

Referring to FIG. 21, a third barrier layer 212 may be formed along the sidewall and bottom of the first hole 210*a* and an upper surface of the first lower insulating interlayer 202.

In an embodiment, the third barrier layer 212 may be formed of, for example, Ti, Ta, TiN, TaN, or a combination thereof. In some example embodiments, the third barrier layer 212 may include the same material as the first barrier pattern 124*b*. In some example embodiments, the third barrier layer 212 may include a material different from that of the first barrier pattern 124*b*.

Figure 22:
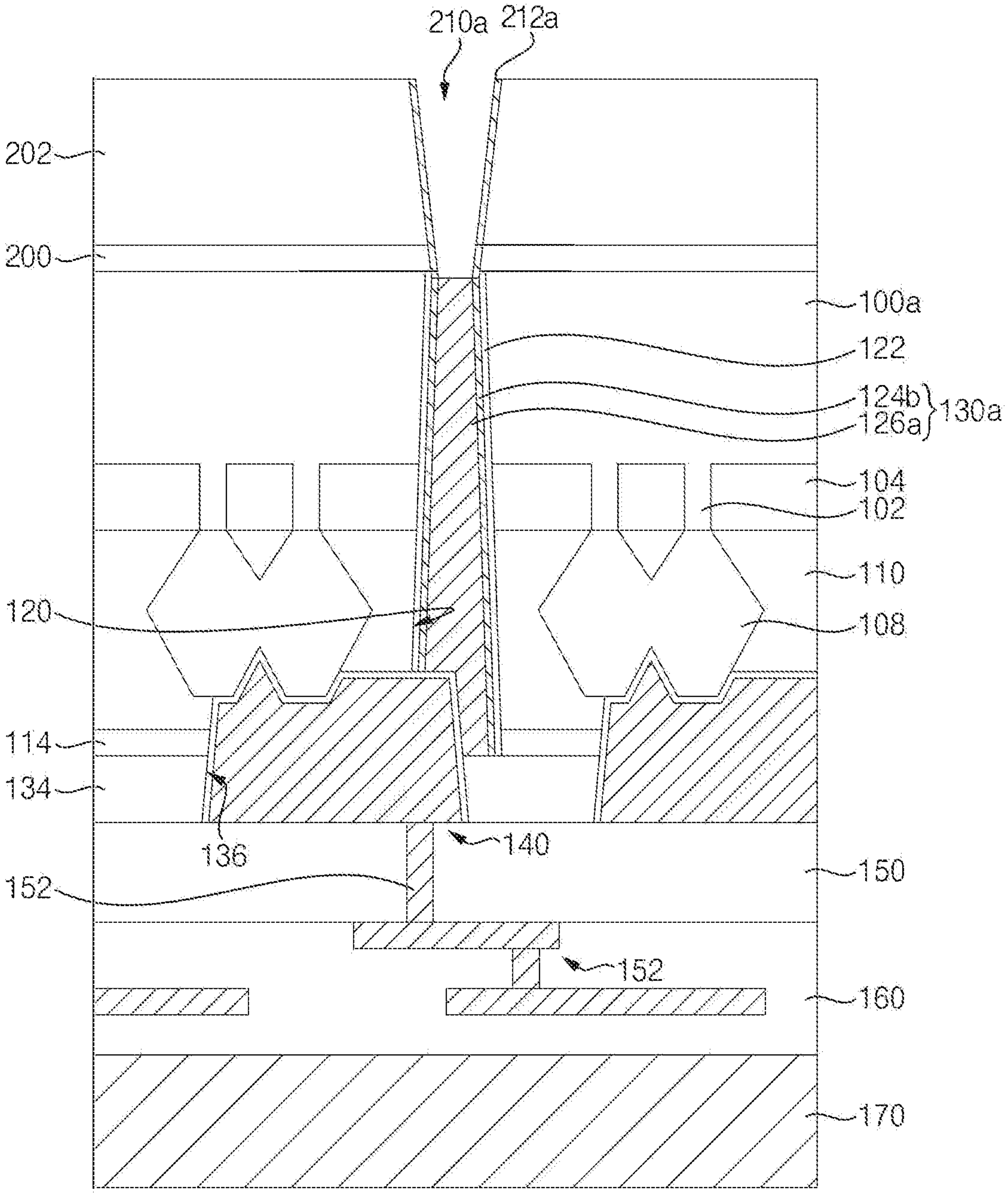

Referring to FIG. 22, the third barrier layer 212 formed on the bottom of the first hole 210*a* and the upper surface of the first lower insulating interlayer 202 may be selectively removed to form the third barrier pattern 212*a*, Accordingly, the first metal pattern 126*a* may be exposed by the bottom of the first hole 210*a*. The third barrier pattern 212*a* may be formed only on the sidewall of the first hole 210*a*.

In an embodiment, the selective removing process may include an inductively coupled plasma etching process. In an embodiment in which the inductively coupled plasma etching process is performed, the etching rate and the etching direction may be easily controlled. Thus, the third barrier layer 212 of a desired portion may be removed.

In an embodiment in which the inductively coupled plasma etching process is performed, the third barrier layer 212 formed on the first metal pattern 126*a* on the bottom of the first hole 210*a* and the third barrier layer 212 formed on the upper surface of the first lower insulating interlayer 202 may be selectively removed to form the third barrier pattern 212*a*, without forming an etching mask. In addition, in an embodiment in which the inductively coupled plasma etching process is performed, re-sputtering in which an etched third barrier layer 212 may be re-deposited may hardly occur.

For example, the third barrier layer 212 may be etched by argon plasma. By applying RF power to the ICP coil, an argon plasma may be generated. Argon ions may be accelerated by the electric field toward the third barrier layer 212. The accelerated argon ions may be bombarded to the third barrier layer 212, so that the third barrier layer 212 may be removed. In this embodiment, since the argon ions may be attracted in the vertical direction, the sidewall of the first hole 210*a* may be hardly etched due to a bombardment of the argon ions. Accordingly, the third barrier layer 212 exposed by the bottom of the first preliminary hole 210 may be selectively etched to form the third barrier pattern 212*a*.

In some example embodiments, the bottom of the first hole 210*a* may have an area substantially the same as an area of an exposed surface of the buried vertical rail 130*a*.

In some example embodiments, an area of the bottom of the first hole 210*a* may be greater than an area of the exposed surface of the buried vertical rail 130*a*. In this embodiment, a third barrier layer 212 contacting the upper surface of the first metal pattern 126*a* may be selectively etched. For example, a portion of the third barrier layer 212 that is not in direct contact with the first metal pattern 126*a* may remain to form the third barrier pattern 212*a*.

Figure 23:
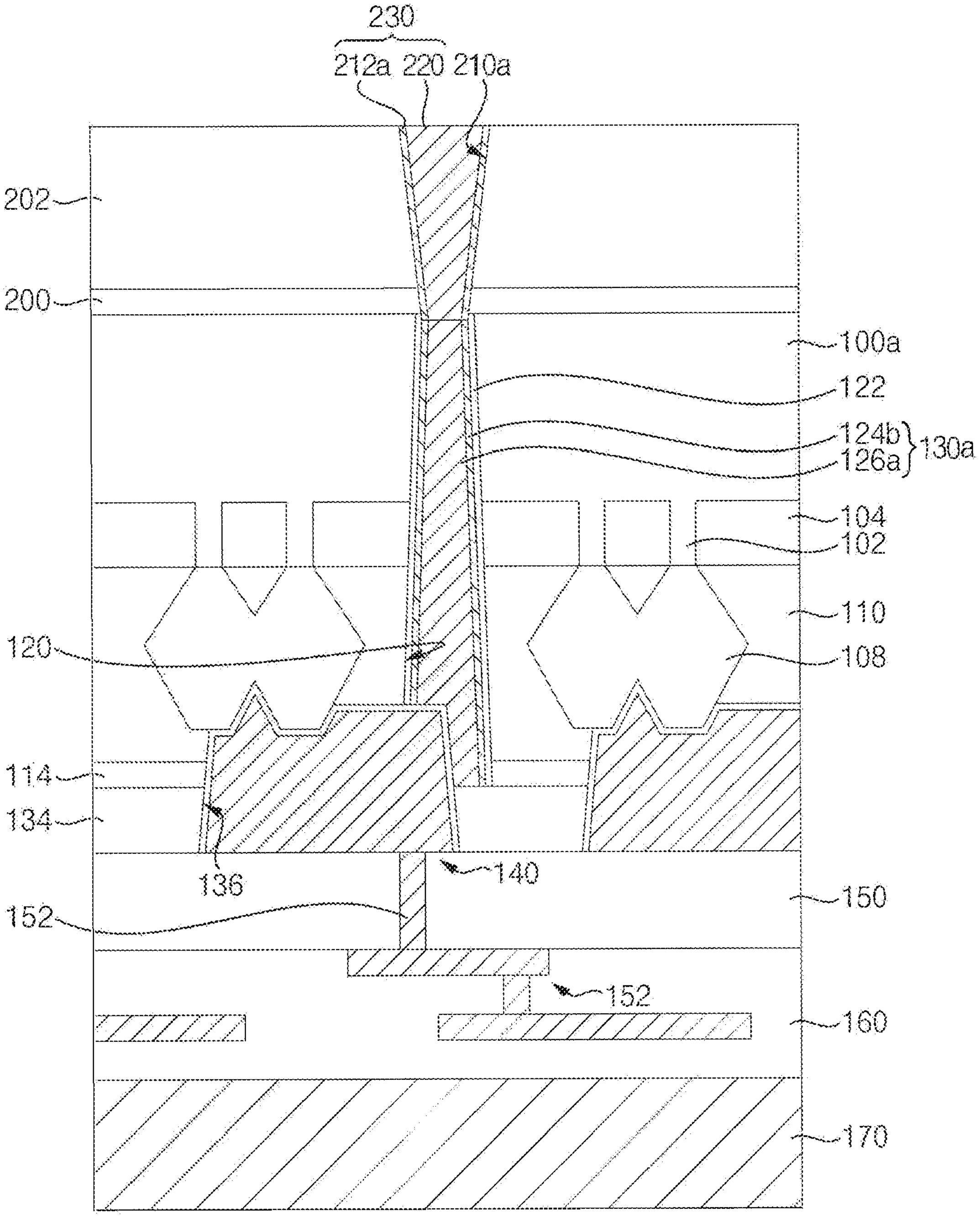

Referring to FIG. 23, a third metal layer may be formed on the third barrier pattern 212*a* and the first lower insulating interlayer 202 to fill the first hole 210*a*. In an embodiment, the third metal layer may include, for example, Cu, W, Mo, Ru, or Nb.

An embodiment in which the third metal layer is formed of copper may be described in more detail for convenience of explanation.

First, a seed layer may be formed on the sidewall and bottom of the first hole 210*a* and the first lower insulating interlayer 202. The seed layer may include, for example, copper. A copper layer may be formed on the seed layer by an electroplating process. The copper layer may completely fill the first hole 210*a*.

In a comparative embodiment in which a residue generated by the re-sputtering of the third barrier layer may be included in the first hole 210*a* before forming the third metal layer, the third metal layer may not be normally deposited due to the residue. Therefore, the third metal layer filling the first hole 210*a* may include void.

However, as described above, when the third barrier layer is selectively etched through the inductively coupled plasma etching process, a residue due to re-sputtering of the third barrier layer may hardly be generated in the first hole 210*a*. Therefore, the void in the third metal layer may be decreased.

The third metal layer may be planarized until an upper surface of the first lower insulating interlayer 202 may be exposed to form a third metal pattern 220 filling the first hole 210*a*. Accordingly, a first lower contact plug 230 including the third barrier pattern 12*a* and the third metal pattern 220 may be formed in the first hole 210*a*.

A bottom surface of the third metal pattern 220 may directly contact a top surface of the first metal pattern 126*a*. A barrier layer may not be formed between the bottom surface of the third metal pattern 220 and the top surface of the first metal pattern 126*a*. In some example embodiments, a portion (e.g., interface) between the third metal pattern 220 and the first metal pattern 126*a* in which the third metal pattern 220 and the first metal pattern 126*a* directly contact each other may not be coplanar with the lower surface (e.g., second surface) of the base layer 100*a*. In some example embodiments, the portion (e.g., interface) between the third metal pattern 220 and the first metal pattern 126*a* in which the third metal pattern 220 and the first metal pattern 126*a* directly contact each other may be positioned at an inner portion of the base layer 100*a*.

As such, a barrier layer may not be formed at an interface between the buried vertical rail 130*a* and the first lower contact plug 230, and thus the first metal pattern 126*a* and the third metal pattern 220 may directly contact each other. Accordingly, contact resistance between the buried vertical rail 130*a* and the first lower contact plug 230 may be decreased.

Figure 24:
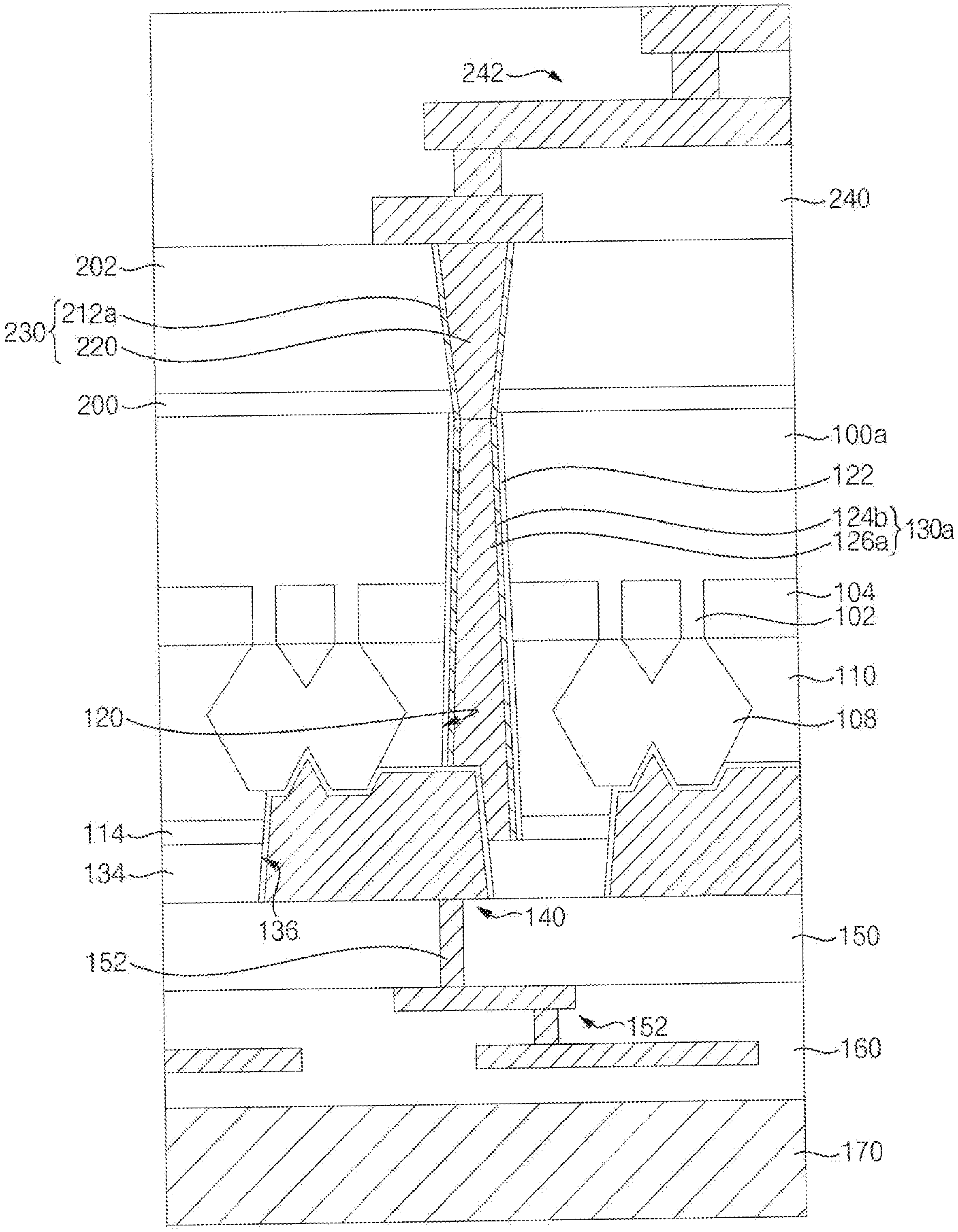

Referring to FIG. 24, a second lower insulating interlayer 240 and a first lower wiring 242 may be formed on the first lower insulating interlayer 202 and the first lower contact plug 230. The second lower insulating interlayer 240 may cover the first lower wiring 242.

The first lower wirings 242 may be formed as multi-layer wirings. The first lower wirings 242 may include contact plugs and conductive lines. The first lower wirings 242 may include a metal material. In an embodiment, the first lower wirings 242 may include, for example, Cu, W, Mo, Ru, or Nb.

The first lower wirings 242 may be positioned on a back side (e.g., the first surface) of the base layer 100*a*. The first lower wirings 242 may be applied power to circuit elements formed on the base layer 100*a*. In some example embodiments, the first lower wiring 242 may include a barrier pattern and a metal pattern.

In example embodiments, a protective layer may be formed on an uppermost insulating interlayer.

The carrier substrate 170 may be removed.

As described above, the semiconductor device may be manufactured by performing the steps shown in FIGS. 6-24.

Figure 25:
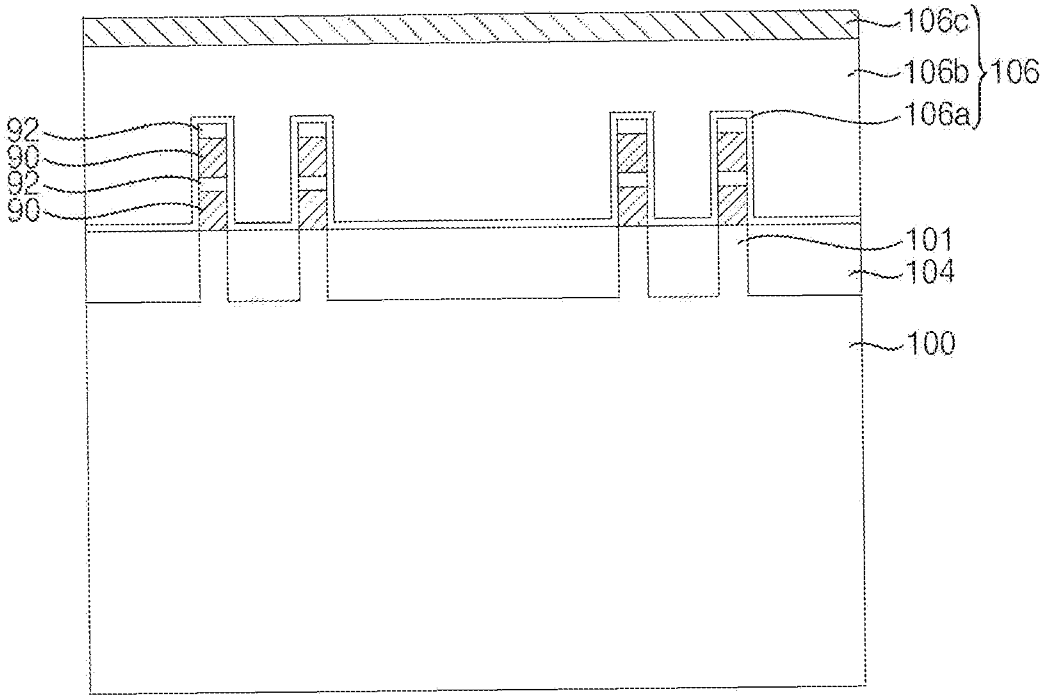
Figure 26:
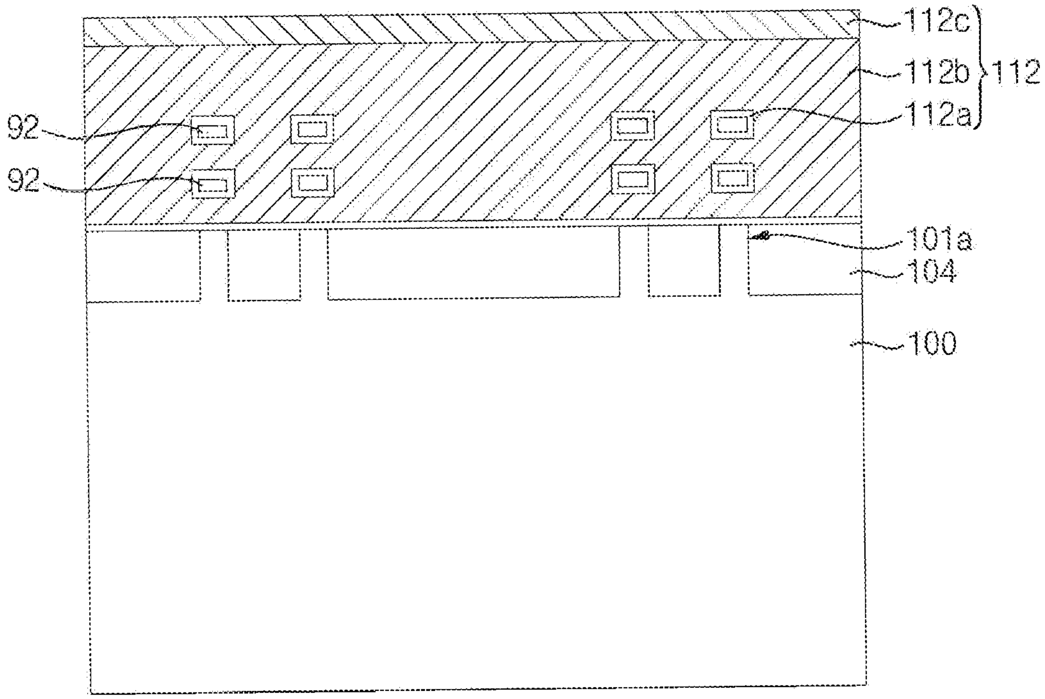

FIGS. 25 and 26 are cross-sectional views illustrating a method of manufacturing a semiconductor device in accordance with some example embodiments.

Hereinafter, a method of manufacturing a semiconductor device including an MBC field effect transistor is described. Accordingly, a method of manufacturing the semiconductor device is the same as embodiments described with reference to FIGS. 6 to 24, except for some processes for forming a transistor.

Referring to FIG. 25, a silicon germanium layer and a silicon layer may be alternately and repeatedly stacked on a substrate 100. A mask pattern may be formed on the uppermost silicon layer. The silicon germanium layer, the silicon layer, and the upper portion of the substrate may be etched using the mask pattern as an etch mask to form preliminary active fins 101. A first structure in which a silicon germanium pattern 90 and a silicon pattern 92 are stacked may be disposed at an upper portion of the preliminary active fin 101.

An isolation layer may be formed to cover the preliminary active fins 101 of the substrate 100, and the isolation layer may completely fill a space between the preliminary active fins 101. An upper portion of the isolation layer may be partially etched until an upper surface of the first structure in the preliminary active fins 101 may be exposed to form an isolation pattern 104.

Thereafter, the process described with reference to FIGS. 7 to 9 may be performed in the same manner. Accordingly, the dummy gate structures may be formed on the preliminary active fins 101 and the isolation pattern 104. Upper portions of the preliminary active fins 101 adjacent to both sides of the dummy gate structure may be etched to form the recesses. The semiconductor pattern may be formed in the recess.

Referring to FIG. 26, a first insulating interlayer may be formed to cover the dummy gate structure and the semiconductor pattern. In an embodiment, the first insulating interlayer may be planarized until an upper portion of the dummy gate structure may be exposed.

In an embodiment, the dummy gate structure may be removed to form a first trench. The silicon germanium patterns exposed by the first trench may be removed to form an active fin 101*a* including gaps.

Thereafter, a gate structure 112 may be formed in the first trench and the gaps. In an embodiment, the gate structure 112 may include a gate insulation layer 112*a*, a gate electrode 112*b* and a capping pattern 112*c*.

A second insulating interlayer 114 may be formed on the first insulating interlayer 110.

An MBC field effect transistor may be formed by the above process.

Thereafter, a semiconductor device may be manufactured by performing the same process as described with reference to FIGS. 12 to 24.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present disclosure.

What is claimed is:

1. A semiconductor device, comprising:

a base layer including a silicon material, the base layer including a first surface and a second surface opposite to the first surface in a vertical direction;

a field effect transistor disposed on the first surface of the base layer;

a first insulating interlayer covering the field effect transistor;

a buried vertical rail passing through the first insulating interlayer and the base layer, the buried vertical rail including a first metal pattern having a sidewall and a first barrier metal pattern surrounding only the sidewall of the first metal pattern;

an etch stop layer on the second surface of the base layer;

a first lower insulating interlayer on the etch stop layer; and a lower contact plug passing through the first lower insulating interlayer and the etch stop layer and directly contacting a lower surface of the buried vertical rail, the lower contact plug including a second metal pattern having a sidewall and a second barrier metal pattern surrounding only the sidewall of the second metal pattern, wherein a bottom surface of the first metal pattern and a top surface of the second metal pattern directly contact each other, and wherein the first barrier metal pattern and the second barrier metal pattern are not disposed at an interface between the top surface of the second metal pattern and the bottom surface of the first metal pattern.

2. The semiconductor device of claim 1, further comprising:

a second lower insulating interlayer on a lower surface of the first lower insulating interlayer; and a lower wiring disposed in the second lower insulating interlayer, the lower wiring is electrically connected to the lower contact plug.

3. The semiconductor device of claim 1, further comprising:

a second insulating interlayer on the first insulating interlayer; and an upper wiring disposed in the second insulating interlayer, the upper wiring is electrically connected to a portion of the field effect transistor.

4. The semiconductor device of claim 1, wherein an interface between the buried vertical rail and the lower contact plug is not coplanar with the second surface of the base layer, the buried vertical rail and the lower contact plug directly contacting each other at the interface.

5. The semiconductor device of claim 1, wherein each of the first and second barrier metal patterns includes Ti, Ta, TiN, TaN or a combination thereof.

6. The semiconductor device of claim 1, wherein each of the first and second metal patterns includes Cu, W, Mo, Ru, or Nb.

7. The semiconductor device of claim 1, further comprising an insulation liner between the buried vertical rail and the base layer, wherein the insulation liner surrounds an outer wall of the buried vertical rail.

8. The semiconductor device of claim 1, wherein:

the buried vertical rail has a sidewall slope having an inner width that gradually decreases from a top portion of the buried vertical rail to a bottom portion of the buried vertical rail; and the lower contact plug has a sidewall slope having an inner width that gradually decreases from a bottom portion of the lower contact plug to a top portion of the lower contact plug.

9. The semiconductor device of claim 1, wherein the field effect transistor includes a fin field effect transistor or a multi-bridge channel field effect transistor.

10. The semiconductor device of claim 1, wherein:

the field effect transistor includes a gate structure and impurity regions; and a first contact plug electrically connects the buried vertical rail and the impurity regions.

11. A semiconductor device, comprising:

a base layer including a silicon material, the base layer including a first surface and a second surface opposite to the first surface in a vertical direction;

active fins protruding from the first surface of the base layer in the vertical direction, the active fins extending in a first direction;

a gate structure on the first surface of the base layer, the gate structure extending in a second direction perpendicular to the first direction and crossing the active fins;

semiconductor patterns on active fins adjacent to both sides of the gate structure, the semiconductor patterns including impurity regions;

a first insulating interlayer on the first surface of the base layer, the first insulating interlayer covering the gate structure and the semiconductor patterns;

a buried vertical rail passing through the first insulating interlayer and the base layer in the vertical direction, the buried vertical rail including a first metal pattern having a sidewall and a first barrier metal pattern surrounding only the sidewall of the first metal pattern;

an etch stop layer on the second surface of the base layer;

a first lower insulating interlayer on the etch stop layer; and a lower contact plug passing through the first lower insulating interlayer and the etch stop layer in the vertical direction and directly contacting a lower surface of the buried vertical rail, the lower contact plug including a second metal pattern having a sidewall and a second barrier metal pattern surrounding only the sidewall of the second metal pattern, wherein a bottom surface of the first metal pattern and a top surface of the second metal pattern directly contact each other, and wherein the first barrier metal pattern and the second barrier metal pattern are not disposed at an interface between the top surface of the second metal pattern and the bottom surface of the first metal pattern.

12. The semiconductor device of claim 11, further comprising a first contact plug on the first insulating interlayer, the first contact plug electrically connecting the buried vertical rail and the semiconductor patterns to each other.

13. The semiconductor device of claim 11, wherein the bottom surface of the first metal pattern and an upper surface of the second metal pattern are aligned with each other in the vertical direction.

14. The semiconductor device of claim 11, wherein:

the buried vertical rail has a sidewall slope having an inner width that gradually decreases from a top portion of the buried vertical rail to a bottom portion of the buried vertical rail; and the lower contact plug has a sidewall slope having an inner width that gradually decreases from a bottom portion of the lower contact plug to a top portion of the first lower contact plug.

15. The semiconductor device of claim 11, further comprising:

a second lower insulating interlayer on a lower surface of the first lower insulating interlayer; and a lower wiring disposed in the second lower insulating interlayer, the lower wiring is electrically connected to the lower contact plug.

16. The semiconductor device of claim 11, further comprising an insulation liner between the buried vertical rail and the base layer, wherein the insulation liner surrounds an outer wall of the buried vertical rail.

17. The semiconductor device of claim 11, wherein the gate structure covers sidewalls and upper surfaces of the active fins.

* * * * *